United States Patent
Crisp et al.

(10) Patent No.: US 9,679,876 B2
(45) Date of Patent: *Jun. 13, 2017

(54) MICROELECTRONIC PACKAGE HAVING AT LEAST TWO MICROELECTRONIC ELEMENTS THAT ARE HORIZONTALLY SPACED APART FROM EACH OTHER

(71) Applicant: Invensas Corporation, San Jose, CA (US)

(72) Inventors: Richard Dewitt Crisp, Hornitos, CA (US); Wael Zohni, San Jose, CA (US); Belgacem Haba, Saratoga, CA (US); Frank Lambrecht, Mountain View, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/168,789

(22) Filed: May 31, 2016

(65) Prior Publication Data

US 2016/0276316 A1    Sep. 22, 2016

Related U.S. Application Data

(63) Continuation of application No. 14/244,007, filed on Apr. 3, 2014, now Pat. No. 9,377,824, which is a (Continued)

(51) Int. Cl.
*H01L 25/065*    (2006.01)
*H01L 23/498*    (2006.01)
(Continued)

(52) U.S. Cl.
CPC ............ *H01L 25/0657* (2013.01); *G06F 1/18* (2013.01); *H01L 23/3128* (2013.01); (Continued)

(58) Field of Classification Search
CPC ... H01L 23/48; H01L 23/481; H01L 23/3114; H01L 23/3128; H01L 23/538; H01L 23/5385
See application file for complete search history.

(56) References Cited

U.S. PATENT DOCUMENTS 3,670,208 A    6/1972    Hovnanian et al.
4,747,081 A    5/1988    Heilveil et al.
(Continued)

FOREIGN PATENT DOCUMENTS

EP    1205977 A2    5/2002
JP    61-093694    5/1986
(Continued)

OTHER PUBLICATIONS

Elpida User's Manual, "Introduction to GDDR5 SGRAM", Document No. E1600E10 (Ver. 1.0), Published Mar. 2010, Japan, URL: http:'www.elpida.com.
(Continued)

*Primary Examiner* — Michael Jung
(74) *Attorney, Agent, or Firm* — Lerner, David, Littenberg, Krumholz & Mentlik, LLP

(57) ABSTRACT

A microelectronic assembly (300) or system (1500) includes at least one microelectronic package (100) having a microelectronic element (130) mounted face up above a first surface (108) of a substrate (102), one or more columns (138, 140) of contacts (132) extending in a first direction (142) along the microelectronic element front face. Columns (104A, 105B, 107A, 107B) of terminals (105 107) exposed at a second surface (110) of the substrate extend in the first direction. First terminals (105) exposed at surface (110) in a central region (112) thereof having width (152) not more than three and one-half times a minimum pitch (150) of the columns of terminals can be configured to carry address information usable to determine an addressable memory
(Continued)

location. An axial plane of the microelectronic element can intersect the central region.

18 Claims, 22 Drawing Sheets

Related U.S. Application Data continuation of application No. PCT/US2012/058398, filed on Oct. 2, 2012, which is a continuation of application No. 13/440,299, filed on Apr. 5, 2012, now Pat. No. 8,659,143, said application No. 14/244,007 is a continuation of application No. PCT/US2012/058407, filed on Oct. 2, 2012, which is a continuation of application No. 13/440,290, filed on Apr. 5, 2012, now Pat. No. 8,659,142, said application No. 14/244,007 is a continuation of application No. PCT/US2012/058273, filed on Oct. 1, 2012, which is a continuation of application No. 13/440,313, filed on Apr. 5, 2012, now Pat. No. 8,405,207.

(60) Provisional application No. 61/600,271, filed on Feb. 17, 2012, provisional application No. 61/542,495, filed on Oct. 3, 2011, provisional application No. 61/542,488, filed on Oct. 3, 2011, provisional application No. 61/542,553, filed on Oct. 3, 2011.

(51) Int. Cl.
  *H01L 23/31* (2006.01)
  *H01L 25/10* (2006.01)
  *H05K 1/18* (2006.01)
  *G06F 1/18* (2006.01)
  *H01L 23/00* (2006.01)
  *H01L 23/367* (2006.01)
  *H01L 23/538* (2006.01)
  *H01L 23/36* (2006.01)
  *H01L 23/48* (2006.01)
  *H01L 23/525* (2006.01)
  *H01L 21/56* (2006.01)
  *H01L 23/50* (2006.01)
  *H05K 1/02* (2006.01)

(52) U.S. Cl.
  CPC .... *H01L 23/3672* (2013.01); *H01L 23/49816* (2013.01); *H01L 23/49838* (2013.01); *H01L 24/24* (2013.01); *H01L 25/0655* (2013.01); *H01L 25/105* (2013.01); *H05K 1/181* (2013.01); *H01L 21/563* (2013.01); *H01L 23/36* (2013.01); *H01L 23/481* (2013.01); *H01L 23/50* (2013.01); *H01L 23/525* (2013.01); *H01L 23/5385* (2013.01); *H01L 24/73* (2013.01); *H01L 2224/16145* (2013.01); *H01L 2224/16225* (2013.01); *H01L 2224/24145* (2013.01); *H01L 2224/32145* (2013.01); *H01L 2224/32225* (2013.01); *H01L 2224/48145* (2013.01); *H01L 2224/48227* (2013.01); *H01L 2224/48465* (2013.01); *H01L 2224/48471* (2013.01); *H01L 2224/73204* (2013.01); *H01L 2224/73253* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06551* (2013.01); *H01L 2225/06562* (2013.01); *H01L 2225/06589* (2013.01); *H01L 2924/01322* (2013.01); *H01L 2924/15311* (2013.01); *H01L 2924/18161* (2013.01); *H01L 2924/3011* (2013.01); *H05K 1/0243* (2013.01); *H05K 2201/10159* (2013.01); *H05K 2201/10545* (2013.01); *H05K 2201/10734* (2013.01); *Y02P 70/611* (2015.11)

(56) References Cited

U.S. PATENT DOCUMENTS

| | | |
|---|---|---|
| 5,148,265 A | 9/1992 | Khandros et al. |
| 5,148,266 A | 9/1992 | Khandros et al. |
| 5,163,024 A | 11/1992 | Heilveil et al. |
| 5,210,639 A | 5/1993 | Redwine et al. |
| 5,480,840 A | 1/1996 | Barnes et al. |
| 5,679,977 A | 10/1997 | Khandros et al. |
| 5,691,570 A | 11/1997 | Kozuka |
| 5,751,553 A | 5/1998 | Clayton |
| 5,777,391 A | 7/1998 | Nakamura et al. |
| 5,821,614 A | 10/1998 | Hashimoto et al. |
| 5,899,705 A | 5/1999 | Akram |
| 5,929,517 A | 7/1999 | Distefano et al. |
| 5,936,305 A | 8/1999 | Akram |
| 5,949,700 A | 9/1999 | Furukawa et al. |
| 5,973,403 A | 10/1999 | Wark |
| 6,086,386 A | 7/2000 | Fjelstad et al. |
| 6,130,116 A | 10/2000 | Smith et al. |
| 6,159,837 A | 12/2000 | Yamaji et al. |
| 6,177,636 B1 | 1/2001 | Fjelstad |
| 6,197,665 B1 | 3/2001 | DiStefano et al. |
| 6,252,264 B1 | 6/2001 | Bailey et al. |
| 6,255,899 B1 | 7/2001 | Bertin et al. |
| 6,261,867 B1 | 7/2001 | Robichaud et al. |
| 6,297,960 B1 | 10/2001 | Moden et al. |
| 6,313,532 B1 | 11/2001 | Shimoishizaka et al. |
| 6,323,436 B1 | 11/2001 | Hedrick et al. |
| 6,343,019 B1 | 1/2002 | Jiang et al. |
| 6,376,769 B1 | 4/2002 | Chung |
| 6,380,318 B1 | 4/2002 | Saito et al. |
| 6,384,473 B1 | 5/2002 | Peterson et al. |
| 6,426,560 B1 | 7/2002 | Kawamura et al. |
| 6,433,422 B1 | 8/2002 | Yamasaki |
| 6,445,594 B1 | 9/2002 | Nakagawa et al. |
| 6,452,266 B1 | 9/2002 | Iwaya et al. |
| 6,461,895 B1 | 10/2002 | Liang et al. |
| 6,462,423 B1 | 10/2002 | Akram et al. |
| 6,521,981 B2 | 2/2003 | Miyazaki et al. |
| 6,560,134 B2 | 5/2003 | Brox et al. |
| 6,577,004 B1 | 6/2003 | Rumsey et al. |
| 6,611,057 B2 | 8/2003 | Mikubo et al. |
| 6,617,695 B1 | 9/2003 | Kasatani |
| 6,619,973 B2 | 9/2003 | Perino et al. |
| 6,620,648 B2 | 9/2003 | Yang |
| 6,633,078 B2 | 10/2003 | Hamaguchi et al. |
| 6,658,530 B1 | 12/2003 | Robertson et al. |
| 6,661,089 B2 | 12/2003 | Huang |
| 6,692,987 B2 | 2/2004 | Lim et al. |
| 6,707,141 B2 | 3/2004 | Akram |
| 6,720,666 B2 | 4/2004 | Lim et al. |
| 6,742,098 B1 | 5/2004 | Halbert et al. |
| 6,744,137 B2 | 6/2004 | Kinsman |
| 6,765,288 B2 | 7/2004 | Damberg |
| 6,781,220 B2 | 8/2004 | Taube et al. |
| 6,821,815 B2 | 11/2004 | Smith et al. |
| 6,836,007 B2 | 12/2004 | Michii et al. |
| 6,876,088 B2 | 4/2005 | Harvey |
| 6,894,379 B2 | 5/2005 | Feurle |
| 6,894,381 B2 | 5/2005 | Hetzel et al. |
| 6,906,415 B2 | 6/2005 | Jiang et al. |
| 6,943,057 B1 | 9/2005 | Shim et al. |
| 6,977,440 B2 | 12/2005 | Pflughaupt et al. |
| 6,982,485 B1 | 1/2006 | Lee et al. |
| 7,061,092 B2 | 6/2006 | Akram et al. |
| 7,061,105 B2 | 6/2006 | Masuda et al. |
| 7,061,121 B2 | 6/2006 | Haba |
| 7,091,064 B2 | 8/2006 | Jiang |
| 7,122,897 B2 | 10/2006 | Aiba et al. |
| 7,123,497 B2 | 10/2006 | Matsui et al. |

(56) References Cited

U.S. PATENT DOCUMENTS

| | | |
|---|---|---|
| 7,138,709 B2 | 11/2006 | Kumamoto |
| 7,141,879 B2 | 11/2006 | Wakamiya et al. |
| 7,145,226 B2 | 12/2006 | Kumamoto |
| 7,151,319 B2 | 12/2006 | Iida et al. |
| 7,164,149 B2 | 1/2007 | Matsubara |
| 7,170,158 B2 | 1/2007 | Choi et al. |
| 7,262,507 B2 | 8/2007 | Hino et al. |
| 7,272,888 B2 | 9/2007 | DiStefano |
| 7,294,928 B2 | 11/2007 | Bang et al. |
| 7,324,352 B2 | 1/2008 | Goodwin |
| 7,368,319 B2 | 5/2008 | Ha et al. |
| 7,372,169 B2 | 5/2008 | Chang |
| 7,389,937 B2 | 6/2008 | Ito |
| 7,405,471 B2 | 7/2008 | Kledzik et al. |
| 7,414,312 B2 | 8/2008 | Nguyen et al. |
| 7,420,284 B2 | 9/2008 | Miyazaki et al. |
| 7,476,975 B2 | 1/2009 | Ogata |
| 7,518,226 B2 | 4/2009 | Cablao et al. |
| 7,535,110 B2 | 5/2009 | Wu et al. |
| 7,550,842 B2 | 6/2009 | Khandros et al. |
| 7,589,409 B2 | 9/2009 | Gibson et al. |
| 7,633,146 B2 | 12/2009 | Masuda et al. |
| 7,633,147 B2 | 12/2009 | Funaba et al. |
| 7,642,635 B2 | 1/2010 | Kikuchi et al. |
| 7,692,931 B2 | 4/2010 | Chong et al. |
| 7,763,964 B2 | 7/2010 | Matsushima |
| 7,763,969 B2 | 7/2010 | Zeng et al. |
| RE41,478 E | 8/2010 | Nakamura et al. |
| RE41,721 E | 9/2010 | Nakamura et al. |
| RE41,722 E | 9/2010 | Nakamura et al. |
| 7,795,721 B2 | 9/2010 | Kurita |
| RE41,972 E | 11/2010 | Lenander et al. |
| 7,855,445 B2 | 12/2010 | Landry et al. |
| 7,989,940 B2 | 8/2011 | Haba et al. |
| RE42,972 E | 11/2011 | Nakamura et al. |
| 8,072,037 B2 | 12/2011 | Murphy et al. |
| 8,138,015 B2 | 3/2012 | Joseph et al. |
| 8,254,155 B1 | 8/2012 | Crisp et al. |
| 8,278,764 B1 | 10/2012 | Crisp et al. |
| 8,338,963 B2 | 12/2012 | Haba et al. |
| 8,345,441 B1 | 1/2013 | Crisp et al. |
| 8,378,478 B2 | 2/2013 | Desai et al. |
| 8,405,207 B1 | 3/2013 | Crisp et al. |
| 8,426,983 B2 | 4/2013 | Takeda et al. |
| 8,432,046 B2 | 4/2013 | Miyata et al. |
| 8,436,457 B2 | 5/2013 | Crisp et al. |
| 8,436,477 B2 | 5/2013 | Crisp et al. |
| 8,441,111 B2 | 5/2013 | Crisp et al. |
| 8,502,390 B2 | 8/2013 | Crisp et al. |
| 8,513,813 B2 | 8/2013 | Crisp et al. |
| 8,513,817 B2 | 8/2013 | Haba et al. |
| 8,525,327 B2 | 9/2013 | Crisp et al. |
| 8,610,260 B2 | 12/2013 | Crisp et al. |
| 8,629,545 B2 | 1/2014 | Crisp et al. |
| 8,653,646 B2 | 2/2014 | Crisp et al. |
| 8,659,139 B2 | 2/2014 | Crisp et al. |
| 8,659,140 B2 | 2/2014 | Crisp et al. |
| 8,659,141 B2 | 2/2014 | Crisp et al. |
| 8,659,142 B2 | 2/2014 | Crisp et al. |
| 8,659,143 B2 | 2/2014 | Crisp et al. |
| 8,670,261 B2 | 3/2014 | Crisp et al. |
| 8,823,165 B2 | 9/2014 | Haba et al. |
| 8,902,680 B2 | 12/2014 | Yamamoto |
| 8,917,532 B2 | 12/2014 | Crisp et al. |
| 8,981,547 B2 | 3/2015 | Crisp et al. |
| 2001/0002727 A1 | 6/2001 | Shiraishi et al. |
| 2001/0013662 A1 | 8/2001 | Kudou et al. |
| 2001/0022740 A1 | 9/2001 | Nuxoll et al. |
| 2001/0038106 A1 | 11/2001 | Coteus et al. |
| 2002/0000583 A1 | 1/2002 | Kitsukawa et al. |
| 2002/0016056 A1 | 2/2002 | Corisis |
| 2002/0027019 A1 | 3/2002 | Hashimoto |
| 2002/0030261 A1 | 3/2002 | Rolda et al. |
| 2002/0043719 A1 | 4/2002 | Iwaya et al. |
| 2002/0053727 A1 | 5/2002 | Kimura |
| 2002/0053732 A1 | 5/2002 | Iwaya et al. |
| 2002/0066950 A1 | 6/2002 | Joshi |
| 2002/0105096 A1 | 8/2002 | Hirata et al. |
| 2002/0130412 A1 | 9/2002 | Nagai et al. |
| 2002/0171142 A1 | 11/2002 | Kinsman |
| 2003/0064547 A1 | 4/2003 | Akram et al. |
| 2003/0089978 A1 | 5/2003 | Miyamoto et al. |
| 2003/0089982 A1 | 5/2003 | Feurle |
| 2003/0107118 A1 | 6/2003 | Pflughaupt et al. |
| 2003/0107908 A1 | 6/2003 | Jang et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0145054 A1 | 7/2004 | Bang et al. |
| 2004/0164382 A1 | 8/2004 | Gerber et al. |
| 2004/0168826 A1 | 9/2004 | Jiang et al. |
| 2004/0184240 A1 | 9/2004 | Su |
| 2004/0201111 A1 | 10/2004 | Thurgood |
| 2004/0245617 A1* | 12/2004 | Damberg ............ H01L 25/0652 257/686 |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0087013 A1 | 4/2006 | Hsieh |
| 2006/0091518 A1 | 5/2006 | Grafe et al. |
| 2006/0170093 A1 | 8/2006 | Pendse |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0052462 A1 | 2/2008 | Blakely et al. |
| 2008/0061423 A1 | 3/2008 | Brox et al. |
| 2008/0088030 A1 | 4/2008 | Eldridge et al. |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0191338 A1 | 8/2008 | Park et al. |
| 2008/0230888 A1 | 9/2008 | Sasaki |
| 2008/0256281 A1 | 10/2008 | Fahr et al. |
| 2008/0265397 A1 | 10/2008 | Lin et al. |
| 2008/0284003 A1* | 11/2008 | Kwang ................. H01L 24/32 257/724 |
| 2009/0001574 A1 | 1/2009 | Fang et al. |
| 2009/0065948 A1 | 3/2009 | Wang |
| 2009/0108425 A1 | 4/2009 | Lee et al. |
| 2009/0140442 A1 | 6/2009 | Lin |
| 2009/0200680 A1 | 8/2009 | Shinohara et al. |
| 2009/0250255 A1 | 10/2009 | Shilling et al. |
| 2009/0250822 A1 | 10/2009 | Chen et al. |
| 2009/0273075 A1 | 11/2009 | Meyer-Berg |
| 2009/0294938 A1 | 12/2009 | Chen |
| 2009/0314538 A1 | 12/2009 | Jomaa et al. |
| 2010/0052111 A1 | 3/2010 | Urakawa |
| 2010/0090326 A1 | 4/2010 | Baek et al. |
| 2010/0102428 A1 | 4/2010 | Lee et al. |
| 2010/0148172 A1* | 6/2010 | Watanabe ............ H01L 22/32 257/48 |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |

(56) References Cited

U.S. PATENT DOCUMENTS

| | | |
|---|---|---|
| 2010/0327457 A1 | 12/2010 | Mabuchi |
| 2011/0042824 A1 | 2/2011 | Koide |
| 2011/0084758 A1 | 4/2011 | Shibata et al. |
| 2011/0110165 A1 | 5/2011 | Gillingham et al. |
| 2011/0140247 A1 | 6/2011 | Pagaila et al. |
| 2011/0149493 A1 | 6/2011 | Kwon et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0153435 A1 | 6/2012 | Haba et al. |
| 2012/0155049 A1 | 6/2012 | Haba et al. |
| 2012/0203954 A1* | 8/2012 | Sun .................... H01L 25/0657 711/103 |
| 2012/0206181 A1 | 8/2012 | Lin et al. |
| 2012/0217642 A1* | 8/2012 | Sun .................... H01L 25/16 257/773 |
| 2012/0217645 A1 | 8/2012 | Pagaila |
| 2012/0313239 A1 | 12/2012 | Zohni |
| 2012/0313253 A1 | 12/2012 | Nakadaira et al. |
| 2013/0009308 A1 | 1/2013 | Kwon |
| 2013/0009318 A1 | 1/2013 | Chia et al. |
| 2013/0015590 A1 | 1/2013 | Haba et al. |
| 2013/0082394 A1 | 4/2013 | Crisp et al. |
| 2013/0083583 A1 | 4/2013 | Crisp et al. |
| 2013/0168843 A1 | 7/2013 | Zohni |
| 2013/0286707 A1 | 10/2013 | Crisp et al. |
| 2013/0307138 A1 | 11/2013 | Crisp et al. |
| 2014/0042644 A1 | 2/2014 | Haba et al. |
| 2014/0055941 A1 | 2/2014 | Crisp et al. |
| 2014/0055942 A1 | 2/2014 | Crisp et al. |
| 2014/0055970 A1 | 2/2014 | Crisp et al. |
| 2014/0362629 A1 | 12/2014 | Crisp et al. |

FOREIGN PATENT DOCUMENTS

| | | |
|---|---|---|
| JP | 63-232389 | 9/1988 |
| JP | 64-001257 A | 1/1989 |
| JP | 2000196008 A | 7/2000 |
| JP | 2002076252 A | 3/2002 |
| JP | 200063767 A | 2/2004 |
| JP | 2004063767 A | 2/2004 |
| JP | 2004152131 A | 5/2004 |
| JP | 2005340724 A | 12/2005 |
| JP | 2006310411 A | 11/2006 |
| JP | 2008135597 A | 6/2008 |
| JP | 3143893 U | 8/2008 |
| JP | 2008198841 A | 8/2008 |
| JP | 2009182163 A | 8/2009 |
| JP | 2010098098 A | 4/2010 |
| JP | 2010282510 A | 12/2010 |
| JP | 2011096268 A | 5/2011 |
| JP | 2011155203 A | 8/2011 |
| KR | 2001-0002214 A | 1/2001 |
| KR | 2005-0119414 A | 12/2005 |
| KR | 2006-0120365 A | 11/2006 |
| KR | 2007-0088177 A | 8/2007 |
| KR | 2009-0008341 A | 1/2009 |
| KR | 2009-0086314 A | 8/2009 |
| TW | 312044 | 8/1997 |
| TW | 428258 | 4/2001 |
| TW | 429561 | 4/2001 |
| TW | 478137 B | 3/2002 |
| TW | 567593 B | 12/2003 |
| TW | M338433 U | 8/2008 |
| TW | 200842998 A | 11/2008 |
| TW | 200901194 A | 1/2009 |
| TW | 200926312 A | 6/2009 |
| TW | M363079 U | 8/2009 |
| TW | M398313 | 2/2011 |
| TW | 201115659 A | 5/2011 |
| TW | 201208004 | 2/2012 |
| TW | M426922 U | 4/2012 |
| TW | 201222684 | 6/2012 |
| TW | 201234556 A | 8/2012 |
| WO | 2010120310 A1 | 10/2010 |

OTHER PUBLICATIONS

Hynix, "2GB (64Mx32) GDDR5 SGRAM HRGQ2H24AFR", Nov. 2011-Feb. 2012.
International Search Report and Written Opinion dated Mar. 21, 2013 for Application No. PCT/US2012/000425.
International Search Report and Written Opinion dated Mar. 21, 2013 for Application No. PCT/US2012/057911.
International Search Report and Written Opinion for Application No. PCT/US2012/046049 dated Jan. 10, 2013.
International Search Report and Written Opinion for Application No. PCT/US2012/046049 dated Nov. 29, 2012.
International Search Report and Written Opinion for Application No. PCT/US2012/046249 dated Mar. 20, 2013.
International Search Report and Written Opinion for Application No. PCT/US2012/046255 dated Mar. 20, 2013.
International Search Report and Written Opinion for Application No. PCT/US2012/057170 dated Mar. 22, 2013.
International Search Report and Written Opinion for Application No. PCT/US2012/057179 dated Apr. 4, 2013.
International Search Report and Written Opinion for Application No. PCT/US2012/057200 dated Mar. 1, 2013.
International Search Report and Written Opinion for Application No. PCT/US2012/057204 dated Aug. 30, 2013.
International Search Report and Written Opinion for Application No. PCT/US2012/057554 dated Feb. 28, 2013.
International Search Report and Written Opinion for Application No. PCT/US2012/057563 dated Mar. 5, 2013.
International Search Report and Written Opinion for Application No. PCT/US2012/057810 dated Jul. 23, 2013.
International Search Report and Written Opinion for Application No. PCT/US2012/058273 dated Mar. 6, 2013.
International Search Report and Written Opinion for Application No. PCT/US2012/058398 dated Jul. 4, 2013.
International Search Report and Written Opinion for Application No. PCT/US2012/058407 dated Mar. 28, 2013.
International Search Report and Written Opinion for Application No. PCT/US2012/058423 dated Mar. 20, 2013.
International Search Report and Written Opinion for Application No. PCT/US2012/058434 dated Jun. 21, 2013.
International Search Report and Written Opinion for Application No. PCT/US2012/058557 dated Mar. 12, 2013.
International Search Report and Written Opinion for Application No. PCT/US2013/056773 dated Dec. 4, 2013.
International Search Report and Written Opinion for Application No. PCT/US2013/056777 dated Jan. 21, 2015.
International Search Report and Written Opinion for Application No. PCT/US2014/041709 dated Nov. 4, 2014.
International Search Report and Written Opinion for Application No. PCT/US2015/042726 dated Nov. 12, 2015.
International Search Report and Written Opinion for Application No. PCT/US2012/057895 dated Jun. 10, 2013.
International Search Report and Written Opinion for Application No. PCT/US2012/058229 dated Jul. 3, 2013.
International Search Report and Written Opinion for Application PCT/US2013/056777 dated Jan. 2, 2014.
International Search Report for Application No. PCT/US2012/057173 dated Aug. 5, 2013.
International Search Report for Application No. PCT/US2012/057905 dated Aug. 20, 2013.
Kang, et al., 8Gb 3D DDR3 DRAM Using Through-Silicon-Via Technology, IEEE, International Solid-State Circuits Conference, 2009, pp. 130-132.
Kang, et al. 8Gb 3D DDR3 DRAM Using Through-Silicon-Via Technology, IEEE, International Solid-State Circuits Conference, 2009, Samsung Electronics, Hwasung, Korea.
Office Action from Taiwan for Application No. 101125197 dated May 19, 2014.

(56) References Cited

OTHER PUBLICATIONS

Partial International Search Report dated Oct. 12, 2012 in International Patent Appl. No. PCT/US2012/046249.
Partial International Search Report dated Oct. 12, 2012 in International Patent Appl. No. PCT/US2012/046255.
Partial International Search Report dated Oct. 26, 2012 in International Patent Appl. No. PCT/US2012/046049.
Partial Search Report for Application No. PCT/US2012/000425 dated Jan. 30, 2013.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/058557 dated Feb. 4, 2013.
Sandforce, "SF-2200 & SF-2100 Client SSD Processors", 2011.
Taiwanese Allowance and Search Report for Application No. 101136592 dated Jun. 27, 2014.
Taiwanese Notice of Allowance for Application No. 102130518 dated Mar. 31, 2015.
Taiwanese Office Action for Application No. 101125193 dated Aug. 4, 2015.
Taiwanese Office Action for Application No. 101136575 dated Oct. 28, 2014.
Taiwanese Office Action for Application No. 101136577 dated May 12, 2015.
Taiwanese Office Action for Application No. 101136578 dated May 12, 2015.
Taiwanese Office Action for Application No. 101136585 dated Jan. 21, 2015.
Taiwanese Office Action for Application No. 101136594 dated Aug. 13, 2014.
Taiwanese Office Action for Application No. 101136595 dated Oct. 27, 2014.
Taiwanese Office Action for Application No. 101136606 dated Mar. 27, 2015.
Taiwanese Office Action for Application No. 102130519 dated May 7, 2015.
U.S. Appl. No. 61/477,877, filed Apr. 21, 2011.
US Amendment for U.S. Appl. No. 13/439,299 dated Jan. 18, 2013.
US Amendment for U.S. Appl. No. 13/440,199 dated Nov. 30, 2012.
US Amendment for U.S. Appl. No. 13/440,280 dated Nov. 30, 2012.
U.S. Appl. No. 13/080,876, filed Apr. 6, 2011.
U.S. Appl. No. 13/306,300, filed Nov. 29, 2011.
U.S. Appl. No. 13/337,565, filed Dec. 27, 2011.
U.S. Appl. No. 13/337,575, filed Dec. 27, 2011.
U.S. Appl. No. 13/346,185, filed Jan. 9, 2012.
U.S. Appl. No. 13/439,228, filed Apr. 4, 2012.
U.S. Appl. No. 13/439,273, filed Apr. 4, 2012.
U.S. Appl. No. 13/439,299, filed Apr. 4, 2012.
U.S. Appl. No. 13/439,354, filed Apr. 4, 2012.
U.S. Appl. No. 13/440,199, filed Apr. 5, 2012.
U.S. Appl. No. 13/440,280, filed Apr. 5, 2012.
U.S. Appl. No. 13/440,290, filed Apr. 5, 2012.
U.S. Appl. No. 13/440,299, filed Apr. 5, 2012.
U.S. Appl. No. 13/440,515, filed Apr. 5, 2012.
U.S. Appl. No. 13/839,402, filed Mar. 15, 2013.
U.S. Appl. No. 13/840,353, filed Mar. 15, 2013.
U.S. Appl. No. 13/840,542, filed Mar. 15, 2013.
U.S. Appl. No. 13/841,052, filed Mar. 15, 2013.
U.S. Appl. No. 13/306,068, filed Nov. 29, 2011.
U.S. Appl. No. 13/346,201, filed Jan. 9, 2012.
U.S. Appl. No. 13/354,747, filed Jan. 20, 2012.
U.S. Appl. No. 13/354,772, filed Jan. 20, 2012.
U.S. Appl. No. 13/439,286, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/440,313, filed Apr. 5, 2012.
US Non Final Office Action dated Oct. 18, 2012 for U.S. Appl. No. 13/439,299.
US Non-Final Office Action for U.S. Appl. No. 13/440,199 dated Aug. 31, 2012.
US Non-Final Office Action for U.S. Appl. No. 13/440,280 dated Aug. 31, 2012.
Written Opinion of the International Preliminary Examining Authority for Application No. PCT/US2014/041709 dated Jun. 1, 2015.

* cited by examiner

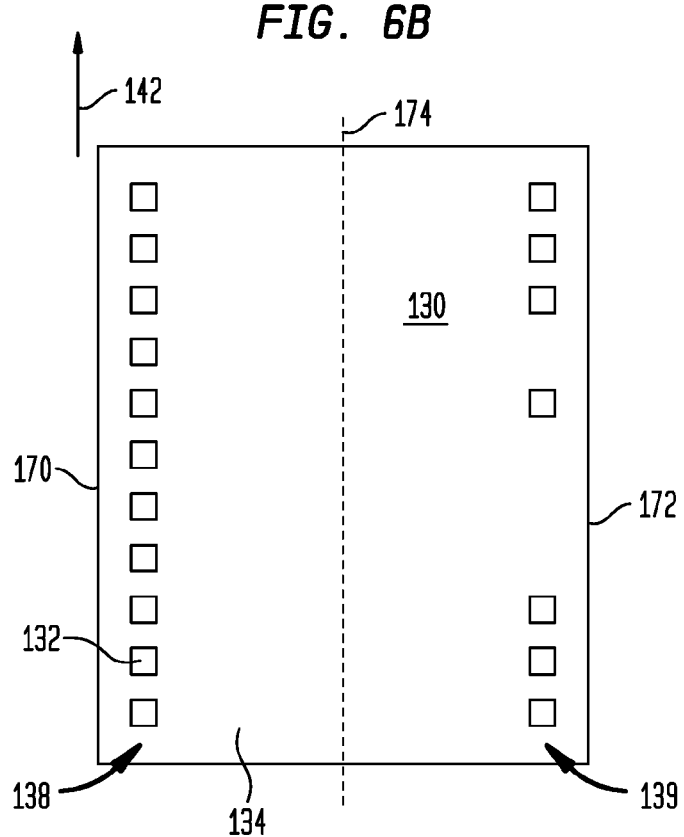
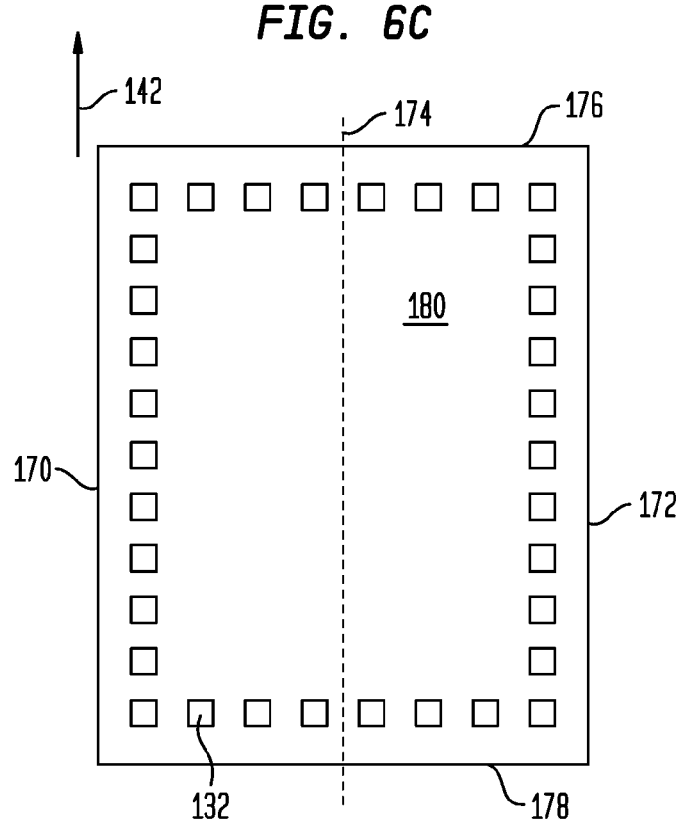

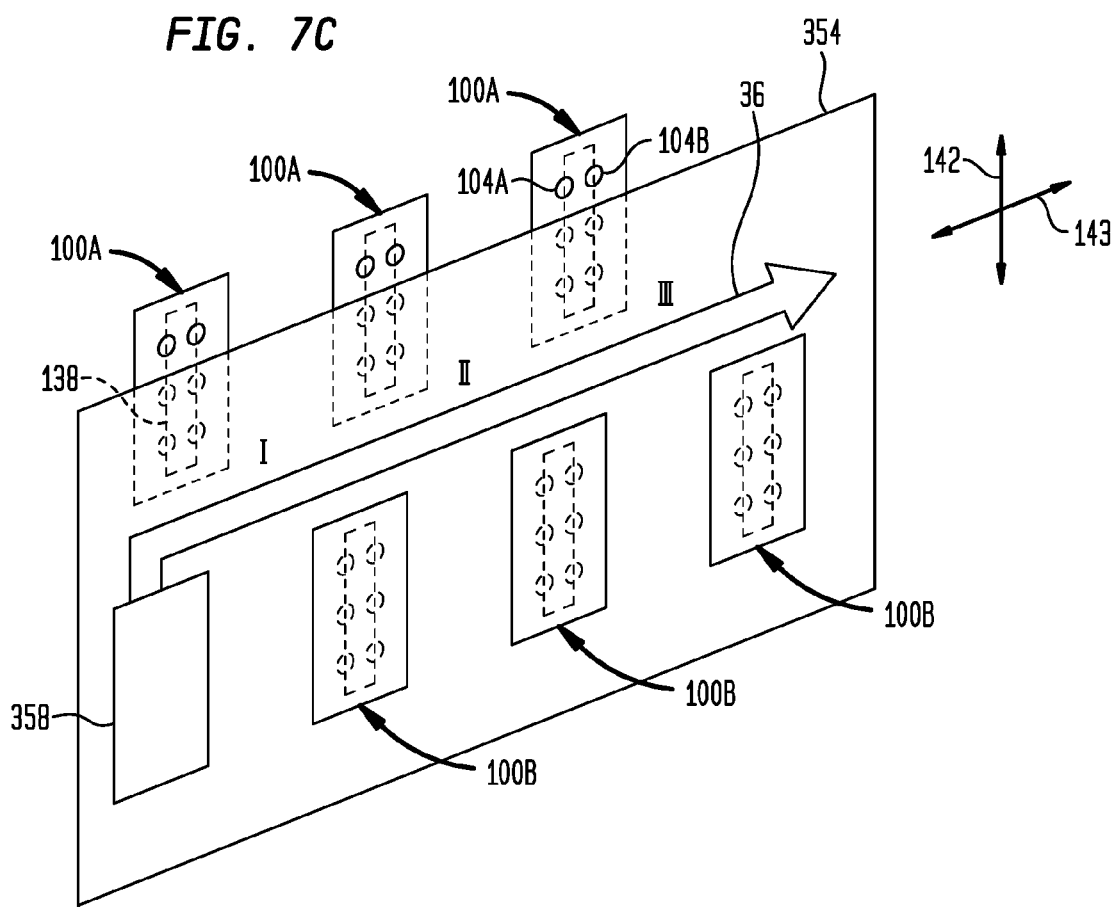

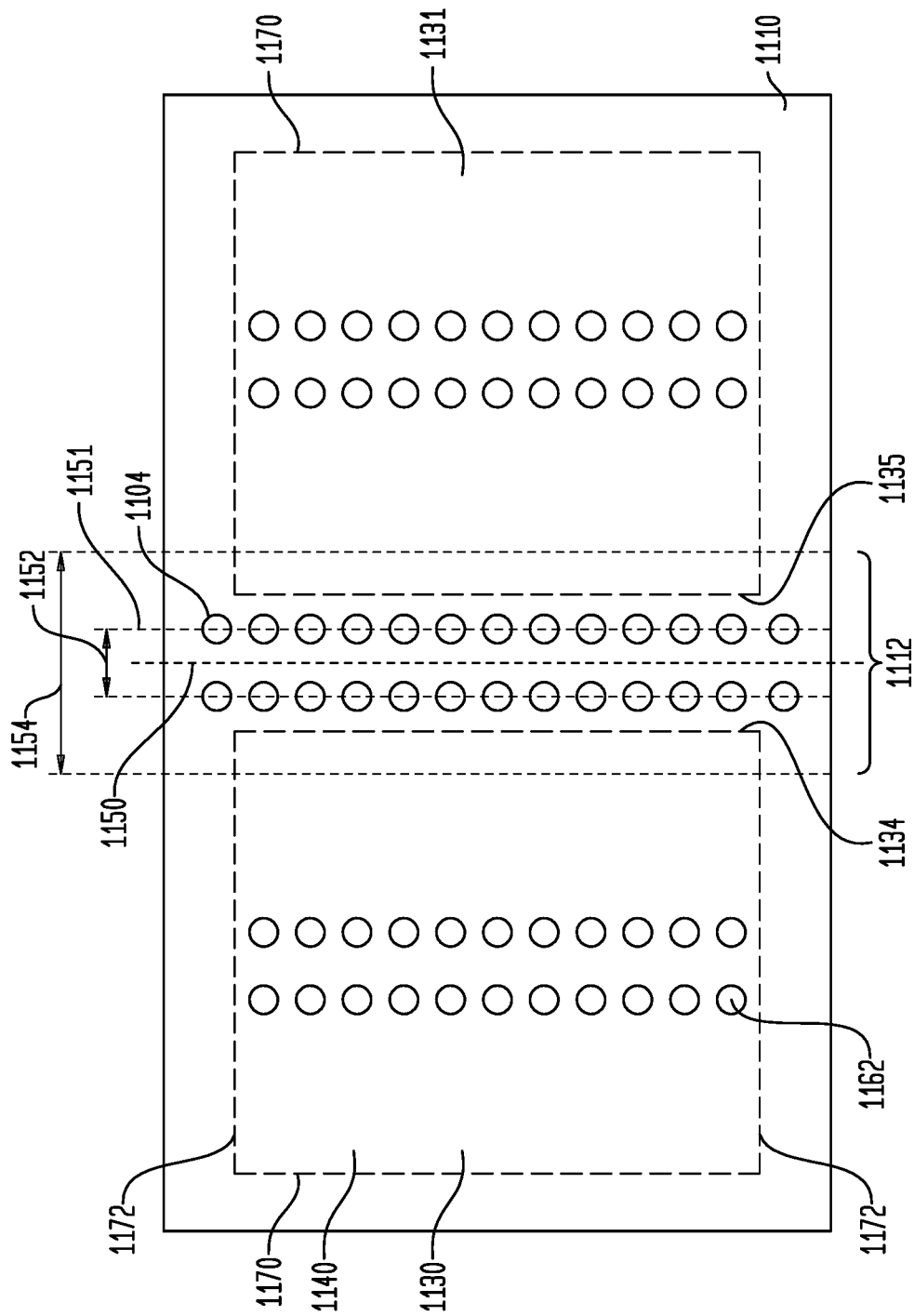

MICROELECTRONIC PACKAGE HAVING AT LEAST TWO MICROELECTRONIC ELEMENTS THAT ARE HORIZONTALLY SPACED APART FROM EACH OTHER

CROSS-REFERENCE TO RELATED APPLICATIONS

This application is a continuation of U.S. application Ser. No. 14/244,007, filed Apr. 3, 2014, now U.S. Pat. No. 9,377,824, which is a continuation of International Application No. PCT/US2012/058273, filed Oct. 1, 2012 and is also a continuation of International Application Nos. PCT/US2012/058398 and PCT/US2012/058407, filed Oct. 2, 2012. International Application No. PCT/US2012/058273 is a continuation of U.S. application Ser. No. 13/440,313, filed Apr. 5, 2012, which application claims the benefit of the filing date of U.S. Provisional Application No. 61/600,271 filed Feb. 17, 2012, 61/542,488 filed Oct. 3, 2011, 61/542,495 filed Oct. 3, 2011, and 61/542,553 filed Oct. 3, 2011. International Application No. PCT/US2012/058398 is a continuation of U.S. application Ser. No. 13/440,299, filed Apr. 5, 2012, which application claims the benefit of the filing date of U.S. Provisional Application No. 61/600,271 filed Feb. 17, 2012, 61/542,488 filed Oct. 3, 2011, 61/542,495 filed Oct. 3, 2011, and 61/542,553 filed Oct. 3, 2011. International Application No. PCT/US2012/058407 is a continuation of U.S. application Ser. No. 13/440,290, filed Apr. 5, 2012, which application claims the benefit of the filing date of U.S. Provisional Application No. 61/600,271 filed Feb. 17, 2012, 61/542,488 filed Oct. 3, 2011, 61/542,495 filed Oct. 3, 2011, and 61/542,553 filed Oct. 3, 2011. The disclosures of all said Applications are hereby incorporated herein by reference.

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single- or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

Conventional microelectronic packages can incorporate a microelectronic element which is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted.

For example, in one conventional microelectronic package 12 seen in FIG. 1, three columns 14 of terminals can be disposed adjacent a first peripheral edge 16 of the package substrate 20 and three other columns 18 of terminals can be disposed adjacent a second peripheral edge 22 of the package substrate 20. A central region 24 of the package substrate 20 in the conventional package does not have any columns of terminals. FIG. 1 further shows a semiconductor chip 11 within the package having element contacts 26 on a face 28 thereof which are electrically interconnected with the columns 14, 18 of terminals of the package 12 through wire bonds 30 extending through an aperture, e.g., bond window, in the central region 24 of package substrate 20. In some cases, an adhesive layer 32 may be disposed between the face 28 of the microelectronic element 11 and the substrate 20 to reinforce the mechanical connection between the microelectronic element and the substrate, with the wire bonds extending through an opening in the adhesive layer 32.

In light of the foregoing, certain improvements in the positioning of terminals on microelectronic packages can be made in order to improve electrical performance, particularly in assemblies which include such packages and a circuit panel to which such packages can be mounted and electrically interconnected with one another.

SUMMARY OF THE INVENTION

In accordance with an aspect of the invention, a microelectronic package can include a substrate having a first surface, a second surface opposite the first surface, and a plurality of substrate contacts exposed at the second surface.

The second surface can extend in the first direction and in a second direction transverse thereto. The microelectronic package includes a microelectronic element having memory storage array function, the microelectronic element having a rear face facing the first surface, a front face opposite the first surface, and first and second opposed edges each extending between the front and rear faces and extending in the first direction parallel to the front face.

The microelectronic element can have one or more columns of element contacts exposed at the front face, each column extending in the first direction along the front face. An axial plane normal to the front face can intersect the front face along a line extending in the first direction and centered relative to the one or more columns of element contacts. Conductive structure may extend above the front face. The conductive structure can electrically connect the element contacts with the substrate contacts.

The microelectronic package may include a plurality of columns of terminals extending in the first direction which are exposed at the second surface of the substrate and electrically connected with the substrate contacts. The terminals can include first terminals exposed at the second surface in a central region of the second surface of the substrate. The first terminals can be configured to carry address information usable by circuitry within the package to determine an addressable memory location from among all the available addressable memory locations of a memory storage array of the microelectronic element. The central region can have a width in the second direction which is not more than three and one-half times a minimum pitch between any two adjacent columns of the parallel columns of the terminals. The axial plane can intersect the central region.

In one example, the microelectronic element may embody a greater number of active devices to provide memory storage array function than any other function.

In one embodiment, the first terminals can be configured to carry all of the address information usable by the circuitry within the package to determine the addressable memory location in the memory storage array. In a particular example, the first terminals can be configured to carry information that controls an operating mode of the microelectronic element. In one example, the first terminals can be configured to carry all of the command signals transferred to the microelectronic package, the command signals being write enable, row address strobe, and column address strobe signals. In an exemplary embodiment, the first terminals can be configured to carry clock signals transferred to the microelectronic package which are clocks usable for sampling signals carrying the address information. In a particular embodiment, the first terminals can be configured to carry all of the bank address signals transferred to the microelectronic package.

In a particular example, the terminals can be configured to connect the microelectronic package to at least one component external to the microelectronic package. In one example, the element contacts can include redistribution contacts exposed at the front face of the microelectronic element. Each redistribution contact can be electrically connected with a contact pad of the microelectronic element through at least one of a trace or a via. In one embodiment, the conductive structure can include wire bonds extending from the element contacts and electrically connected with the substrate contacts. In an exemplary embodiment, the first terminals may be arranged in no more than two of the columns of terminals. In a particular embodiment, the first terminals can be arranged in a single one of the columns of terminals. In one example, the first terminals may be arranged in no more than four of the columns of terminals.

In an exemplary embodiment, the substrate can have first and second opposed edges between the first and second opposed surfaces. The first and second edges can extend in the first direction. The second surface can have first and second peripheral regions adjacent to the first and second edges, respectively. The central region can separate the first and second peripheral regions. The terminals can include a plurality of second terminals exposed at the second surface in at least one of the peripheral regions. At least some of the second terminals can be configured to carry information other than the address information. In one embodiment, at least some of the second terminals can be configured to carry data signals. In a particular example, the substrate can include a dielectric element having a coefficient of thermal expansion ("CTE") in the plane of the dielectric element of less than 30 parts per million per degree Celsius ("ppm/° C."). In an exemplary embodiment, the substrate can include an element having a CTE of less than 12 ppm/° C.

In accordance with another aspect of the invention, a microelectronic package can include a substrate having a first surface, a second surface opposite the first surface, a plurality of substrate contacts exposed at the first surface, and a microelectronic element having a rear face facing the first surface of the substrate, the microelectronic element having memory storage array function. In one example, the microelectronic element may have a greater number of active devices configured for providing memory storage array function than any other function. Conductive structure, which may extend above the front face, electrically connects the contacts with the substrate contacts. A plurality of parallel columns of terminals can be exposed at the second surface of the substrate and extending in a first direction along the second surface, the terminals electrically connected with the substrate contacts. The microelectronic element can have a front face opposite the front face and facing away from the first surface, and first and second opposed edges each extending between the front and rear faces and extending in a first direction parallel to the front face. The microelectronic element can have at least one column of element contacts extending in the first direction along the front face. The first and second edges can define an axial plane extending in the first direction and also in a third direction normal to the rear face of the microelectronic element. The axial plane can be centered relative to the first and second edges.

The terminals can include first terminals exposed at the second surface of the substrate in a central region of the second surface. The first terminals can be configured to carry a majority of the address information usable by circuitry within the package to determine an addressable memory location from among all the available addressable memory locations of a memory storage array of the microelectronic element. The central region can have a width in the second direction. The width of the central region may be not more than three and one-half times a minimum pitch between any two adjacent columns of the parallel columns of the terminals. The axial plane can intersect the central region. In one embodiment, the first terminals can be configured to carry at least three-quarters of the address information usable by the circuitry within the package to determine the addressable memory location in the memory storage array.

In accordance with yet another aspect of the invention, a microelectronic package can include a substrate having a first surface, a second surface opposite the first surface, a plurality of first substrate contacts exposed at the first surface and a plurality of second substrate contacts exposed at the first surface. The microelectronic package can include first and second microelectronic elements each having memory storage array function. In one example, the microelectronic package can embody a greater number of active devices to provide memory storage array function than any other function.

The first and second microelectronic elements can be spaced apart from one another on the first surface, and can have parallel first edges each extending in the first direction. An axial plane normal to the first surface of the substrate can extend in the first direction and can be centered among the first edges. The first and second microelectronic elements can have rear faces facing the first surface, front faces opposite the rear faces, and a plurality of contacts exposed at the front faces. Conductive structure, which may extend above the front faces, can electrically connect the contacts of the first and second microelectronic elements with the first and second substrate contacts, respectively.

A plurality of parallel columns of terminals can be exposed at the second surface of the substrate and electrically connected with the first and second substrate contacts. The terminals can include first terminals exposed in a central region of the second surface of the substrate. The columns of terminals may extend in the first direction. The first terminals can be configured to carry address information usable by circuitry within the package to determine an addressable memory location from among all the available addressable memory locations of a memory storage array within the first and second microelectronic elements. The central region can have a width in the second direction. The width of the central region may be not more than three and one-half times a minimum pitch between any two adjacent columns of the parallel columns of the terminals. The axial plane can intersect the central region.

In one embodiment, the first terminals can be configured to carry all of the address information usable by the circuitry within the package to determine the addressable memory location in the memory storage array. In a particular example, the first terminals can be configured to carry information that controls an operating mode of a microelectronic element of the first and second microelectronic elements. In one example, the first terminals can be configured to carry clock signals and all of the command signals, address signals, and bank address signals transferred to the microelectronic package, the command signals being write enable, row address strobe, and column address strobe, and the clock signals being clocks used for sampling signals carrying the address information.

In an exemplary embodiment, the front faces of the first and second microelectronic elements can extend in a single plane parallel to the first surface of the substrate. In a particular example, the conductive structure can include wire bonds extending from the contacts of the first and second microelectronic elements and electrically connected with the respective first and second substrate contacts. In one example, the first terminals may be arranged in no more than four of the columns of terminals. In one example, the contacts of each of the microelectronic elements can include redistribution contacts exposed at the front face of the respective microelectronic element. Each redistribution contact can be electrically connected with a contact pad of the respective microelectronic element through at least one of a trace or a via. At least some of the redistribution contacts can be displaced from the contacts of the respective microelectronic element in at least one direction along the front face of the microelectronic element.

In a particular example, the substrate can have first and second opposed edges between the first and second opposed surfaces. The first and second edges can extend in the first direction. The second surface can have first and second peripheral regions adjacent to the first and second edges, respectively. The central region can separate the first and second peripheral regions. The terminals can include a plurality of second terminals exposed at the second surface in at least one of the peripheral regions. At least some of the second terminals can be configured to carry information other than the address information. In one embodiment, at least some of the second terminals can be configured to carry data signals.

In accordance with still another aspect of the invention, a microelectronic package can include a substrate having a first surface, a plurality of first substrate contacts exposed at the first surface, and a plurality of second substrate contacts exposed at the first surface, the package including first and second microelectronic elements having memory storage array function. In one example, each microelectronic element may embody a greater number of active devices to provide memory storage array function than any other function. The microelectronic package includes conductive structure electrically connecting the contacts of the microelectronic elements with the substrate contacts. In some cases, the conductive structure can extend above the front face of each microelectronic element, and a plurality of parallel columns of terminals can be exposed at a second surface of the substrate and electrically connected with the first and second substrate contacts. The second surface of the substrate can be opposite the first surface. The second surface can extend in a first direction and in a second direction transverse thereto.

The first and second microelectronic elements can be spaced apart from one another on the first surface, and can have first parallel edges each extending in the first direction. An axial plane normal to the first surface of the substrate can extend in the first direction and can be centered among the first edges. The first and second microelectronic elements can have rear faces facing the first surface, front faces opposite the rear faces, and a plurality of contacts exposed at the front faces. The conductive structure can electrically connect the contacts of the first and second microelectronic elements with the first and second substrate contacts, respectively.

The terminals can include first terminals exposed a the second surface in a central region of the second surface of the substrate. The first terminals can be configured to carry a majority of the address information usable by circuitry within the package to determine an addressable memory location from among all the available addressable memory locations of a memory storage array of the first and second microelectronic elements. The central region can have a width in the second direction. The width of the central region may be not more than three and one-half times a minimum pitch between any two adjacent columns of the parallel columns of the terminals. The axial plane can intersect the central region. In a particular example, the terminals can be configured to carry at least three-quarters of the address information usable by the circuitry within the package to determine the addressable memory location in the memory storage array.

An aspect of the invention provides a microelectronic package comprising a substrate having a first surface, a second surface opposite the first surface, and a plurality of substrate contacts exposed at the second surface. A plurality of stacked semiconductor chips may overlie the first surface, at least one of the semiconductor chips having a front face facing away from the first surface, and a plurality of contacts exposed at the front face. At least some of the contacts can be disposed at positions of at least one column thereof extending in a first direction along the front face. An axial plane normal to the front face of the at least one semiconductor chip can extend in the first direction and be centered relative to the at least one column of contacts. The package further includes conductive structure electrically connecting the contacts with the substrate contacts, which in one example, can extend above the front face of the at least one semiconductor chip.

Terminals exposed at the second surface can be disposed at positions within a plurality of parallel columns each extending in the first direction. The terminals can be electrically connected with the substrate contacts and can include a plurality of first terminals exposed in a central region of the second surface, the first terminals configured to carry address information usable by circuitry within the package to determine an addressable memory location of a memory storage array of at least one of the stacked semiconductor chips having memory storage array function, The central region can have a width in a direction transverse to the second direction, the width not more than three and one-half times a minimum pitch between any two adjacent parallel columns of the terminals, wherein the axial plane intersects the central region.

In one example, the microelectronic element may embody a greater number of active devices configured for providing memory storage array function than any other function.

In one example, the at least one semiconductor chip having the front face facing away from the first surface can be a first semiconductor chip, and the stacked semiconductor chips can include at least one second semiconductor chip overlying the front face of the first semiconductor chip and electrically interconnected with the first semiconductor chip.

In one example, at least one of the first semiconductor chip or the at least one second semiconductor chip may be configured to perform at least one of: partially or fully decode information received at a contact thereof, or regenerate information received at the contact thereof for transfer to another of at least one of the first semiconductor chip or to another of the at least one second semiconductor chip.

In one example, at least some of the first and second semiconductor chips can be electrically connected with one another by a plurality of through-silicon vias.

In one example, at least one of the first semiconductor chip or the at least one second semiconductor chip can embody a greater number of active devices to provide memory storage array function than any other function.

In one example, at least some of the electrical interconnections between the first and second semiconductor chips can be through wire bonds extending between at least some contacts of the first semiconductor chip and at least some contacts exposed at a face of the at least one second semiconductor chip which faces away from the first surface.

In one example, the wire bonds may include wire bonds extending from the contacts adjacent to first and second opposed edges of the at least one second semiconductor chip.

In one example, the wire bonds may include wire bonds extending from the contacts adjacent to a first edge of each of a plurality of the at least one second semiconductor chips. The second semiconductor chips may have contact-bearing faces facing away from the front face of the first semiconductor chip and can be staggered such that at least some contacts of each second semiconductor chip are exposed beyond the first edge of each second semiconductor chip disposed thereabove.

In one example, at least some of the electrical interconnections between the first and second semiconductor chips can be through conductors disposed on or within the substrate.

In one example, the at least one second semiconductor chip has contacts on a face confronting the front face of the first semiconductor chip. The contacts of the at least one second semiconductor chip can face and be joined to corresponding contacts on the front face of the first semiconductor chip.

In one example, the first semiconductor chip can be configured to regenerate the address information for transfer to the at least one second semiconductor chip.

In one example, the first semiconductor chip can be configured to at least partially decode at least one of address information or command information received at the first terminals for transfer to the at least one second semiconductor chip.

In one example, the at least one second semiconductor chip can be a plurality of second semiconductor chips electrically interconnected with one another, wherein at least some of the electrical connections between the plurality of second semiconductor chips can be through wire bonds.

In one example, the at least one second semiconductor chip can be a plurality of second semiconductor chips electrically interconnected with one another. In such example, at least some of the electrical connections between the plurality of second semiconductor chips can be through electrically conductive traces extending along at least one edge of the microelectronic element.

In one example, the at least one second semiconductor chip can be a plurality of second semiconductor chips electrically interconnected with one another by a plurality of through-silicon vias.

In one example, each of the first and second semiconductor chips can embody a greater number of active devices to provide memory storage array function than any other function.

In one example, the first semiconductor chip can be configured to regenerate at least some of the address information received at the first terminals for transfer to each second semiconductor chip, and each second semiconductor chip may be not configured to regenerate the address information for transfer to another semiconductor chip of the first and second semiconductor chips.

In one example, the first semiconductor chip can be configured to at least partially decode the address information received at the first terminals for transfer to each second semiconductor chip, and each second semiconductor chip may be not configured to fully decode the address information.

In one example, the first semiconductor chip can be configured to at least partially decode information received at at least one of the first terminals for controlling an operating mode of the at least one second semiconductor chip.

In one example, the at least one second semiconductor chip may include a dynamic random access memory ("DRAM") storage array.

In one example, the memory storage array function of the at least one second semiconductor chip can be implemented in NAND flash, resistive RAM, phase-change memory, magnetic RAM, static RAM, spin-torque RAM, or content-addressable memory technology.

A microelectronic package according to another aspect of the invention can include a substrate having first and second opposed surfaces and a plurality of substrate contacts exposed at the first surface. First and second microelectronic elements each having memory storage array function can be spaced apart from one another in a direction along the first surface and may have first parallel edges each extending in the first direction. An axial plane normal to the first surface may extend in the first direction and can be centered among the first parallel edges. Each microelectronic element may have a front face facing away from the first surface and a plurality of substrate contacts exposed at the front face. The contacts of each microelectronic element can be electrically connected with the substrate contacts through conductive structure.

A plurality of terminals can be exposed at the second surface at positions within a plurality of parallel columns. The terminals can be electrically connected with the substrate contacts. The terminals can include first terminals exposed in a central region of the second surface of the substrate, the first terminals being configured to carry address information usable by circuitry within the package to determine an addressable memory location of a memory storage array of the microelectronic elements.

The central region can have a width in the second direction, the width of the central region not more than three and one-half times a minimum pitch between any two adjacent columns of the parallel columns of the terminals. The axial plane may intersect the central region.

In one example, each of the microelectronic elements may embody a greater number of active devices to provide memory storage array function than any other function.

In one example, the first terminals can be configured to carry all of the address information usable by the circuitry within the package to determine the addressable memory location.

In one example, the first terminals can be configured to carry information that controls an operating mode of at least one of the microelectronic elements.

In one example, the first terminals can be configured to carry clock signals and the command signals, address signals, and bank address signals transferred to the microelectronic package, the command signals being write enable, row address strobe, and column address strobe, and the clock signals being clocks used for sampling signals carrying the address information.

In one example, the front faces of each of the microelectronic elements can extend in a single plane parallel to the first surface of the substrate.

In one example, the microelectronic package may further include third and fourth microelectronic elements spaced apart from one another in a direction parallel to the first surface. The third and fourth microelectronic elements may have front surfaces facing away from the first surface and first parallel edges extending in the first direction and a plurality of element contacts exposed at the front surface. The contacts of each microelectronic element may include at least one column thereof extending in the first direction adjacent to at least one of the first parallel edges of such microelectronic element. The axial plane can be centered among the first edges of the first, second, third and fourth microelectronic elements.

In one example, the central region can be disposed within an area of the substrate beyond which none of the faces of the first, second, third or fourth microelectronic elements extend.

In one example, each of the microelectronic elements may have two first parallel edges extending in the same direction as the columns of contacts on the respective microelectronic element, and two second parallel edges extending in a direction transverse to the first edge. A plane containing either first edge of at least one of the microelectronic elements and normal to the face of such microelectronic element can intersect the first edge of another of the microelectronic elements.

In accordance with an aspect of the invention, a microelectronic assembly can include a circuit panel having a first surface, a second surface opposite the first surface, and panel contacts exposed at each of the first and second opposed surfaces, and first and second microelectronic packages having terminals mounted to the panel contacts at the first and second surfaces, respectively. The circuit panel can electrically interconnect at least some terminals of the first microelectronic package with at least some corresponding terminals of the second microelectronic package. Each of the first and second microelectronic packages can include a substrate having a first surface, a second surface opposite the first surface, and a plurality of substrate contacts exposed at the first surface. Each package may include a microelectronic element having memory storage array function. In one example, the microelectronic element may include a greater number of active devices configured for providing memory storage array function than any other function. The microelectronic element may have a front face facing away from the first surface of the substrate and one or more columns of element contacts exposed at the front face and extending in a first direction along the front face, such that an axial plane normal to the front face extends in the first direction and is centered relative to the one or more columns of element contacts. Conductive structure, which in some cases may extend above the front face of the microelectronic element, electrically connects the contacts of the microelectronic element with the substrate contacts.

A plurality of parallel columns of terminals can extend in the first direction, which are exposed at the second surface and electrically connected with the substrate contacts. The terminals can include first terminals exposed in a central region of the second surface of the substrate. The first terminals can be configured to carry a majority of the address information usable by circuitry within the package to determine an addressable memory location from among all the available addressable memory locations of a memory storage array of the microelectronic element. The central region in some cases may have a width in the second direction which is not more than three and one-half times a minimum pitch between any two adjacent columns of the parallel columns of the terminals, and the axial plane may intersect the central region.

In one embodiment, the first terminals of each microelectronic package can be configured to carry all of the address information usable by the circuitry within the respective microelectronic package to determine an addressable memory location. In a particular example, the first terminals of each microelectronic package can be configured to carry information that controls an operating mode of the microelectronic element of the respective microelectronic package. In one example, the first terminals of each microelectronic package can be configured to carry all of the command signals transferred to the respective microelectronic package, the command signals being write enable, row address strobe, and column address strobe signals.

In an exemplary embodiment, the first terminals of each microelectronic package can be configured to carry clock signals transferred to the respective microelectronic package, the clock signals being clocks used for sampling signals carrying the address information. In one embodiment, the first terminals of each microelectronic package can be configured to carry all of the bank address signals transferred to the respective microelectronic package. In an exemplary embodiment, at least the first terminals of the first and second microelectronic packages can be arranged at corresponding positions of grids, respectively. The grids can be aligned within one ball pitch of one another in x and y orthogonal directions parallel to the first and second circuit panel surfaces.

In a particular example, the grids can be aligned with one another in the x and y orthogonal directions such that the terminals of the grids are coincident with one another. In one embodiment, each position of each grid can be occupied by one of the terminals. In an exemplary embodiment, at least one position of each grid may not be occupied by a terminal. In a particular embodiment, at least half of the positions of the grids of the first and second packages can be aligned with one another in x and y orthogonal directions parallel to the first surface of the circuit panel. In an exemplary embodiment, the grids of the first and second microelectronic packages can be functionally and mechanically matched. In one example, a length of a stub of at least one of electrical connections between one of the first terminals of the first microelectronic package and a corresponding one of the first terminals of the second microelectronic package can be less than seven times a minimum pitch of the first terminals of each of the microelectronic packages.

In an exemplary embodiment, at least some of the electrical connections through the circuit panel between the first terminals of the first and second microelectronic packages can have an electrical length of approximately a thickness of the circuit panel. In a particular example, the signal assignments of the first terminals can be the same on each of the first and second packages. The first terminals on each of the first and second packages can be disposed at positions within first and second columns of terminals. The first column of terminals of the first package can be aligned within one ball pitch in x and y orthogonal directions with the second column of terminals of the second package. The second column of terminals of the first package can be aligned within one ball pitch in x and y orthogonal directions with the first column of terminals of the second package.

In one example, the total combined length of the conductive elements connecting a pair of electrically coupled first and second panel contacts exposed at the first and second surfaces of the circuit panel can be less than seven times a smallest pitch of the panel contacts. In one embodiment, the circuit panel can include a bus having a plurality of conductors configured to carry all of the address information transferred to each of the microelectronic packages. The conductors can extend in a direction parallel to the first and second surfaces.

In an exemplary embodiment, the first terminals of each microelectronic package can be disposed at positions within a single column of terminals of the respective microelectronic package. The circuit panel may include no more than one routing layer for routing of the address information between a connection site on the circuit panel at which the terminals of the first and second microelectronic packages are electrically connected and a different connection site at which the terminals of at least a third microelectronic package are electrically connected.

In a particular embodiment, the first terminals of each microelectronic package may be disposed at positions within no more than two parallel columns of terminals of the respective microelectronic package. The circuit panel can include no more than two routing layers for routing of the address information between a connection site on the circuit panel at which the terminals of the first and second microelectronic packages are electrically connected and a different connection site at which the terminals of at least a third microelectronic package are electrically connected. In one example, the circuit panel may have no more than one routing layer for the routing of the address information.

In one example, each microelectronic package can include a buffer element electrically connected to at least some of the terminals and the microelectronic element in the respective microelectronic package. Each buffer element can be configured to regenerate at least one signal received at one or more of the terminals of the respective microelectronic package.

In an exemplary embodiment, the circuit panel can include an element having a coefficient of thermal expansion ("CTE") of less than 12 parts per million per degree Celsius ("ppm/° C."). The panel contacts exposed at the first and second surfaces can be connected by vias extending through the element. In a particular example, the element can consist essentially of semiconductor, glass, ceramic or liquid crystal polymer material.

In accordance with an aspect of the invention, a microelectronic assembly can include a circuit panel having a first surface, a second surface opposite the first surface, and panel contacts exposed at each of the first and second surfaces. First and second microelectronic packages can have terminals mounted to the panel contacts at the first and second surfaces, respectively. The circuit panel can electrically interconnect at least some terminals of the first microelectronic package with at least some corresponding terminals of the second microelectronic package. Each of the first and second microelectronic packages may include a substrate having first and second opposed surfaces. A plurality of substrate contacts may be exposed at the first surface of the substrate.

Each microelectronic package may include first and second microelectronic elements each having memory storage array function. The first and second microelectronic elements can be spaced apart from one another in a direction along the first surface of the substrate and may have first parallel edges each extending in the first direction, wherein an axial plane normal to the first surface of the substrate extends in the first direction and is centered among the first parallel edges. Each microelectronic element may have a front face facing away from the first surface of the substrate and a plurality of contacts exposed at the front face electrically connected with the substrate contacts through conductive structure.

A plurality of terminals can be exposed at the second surface of the substrate at positions within a plurality of parallel columns. The terminals can be electrically connected with the substrate contacts, the terminals including first terminals exposed at a central region of the second surface of the substrate. The first terminals can be configured to carry address information usable by circuitry within the package to determine an addressable memory location of a memory storage array of the microelectronic elements. The central region may have a width in a second direction transverse to the first direction, wherein the width of the central region is not more than three and one-half times a minimum pitch between any two adjacent columns of the parallel columns of the terminals, and the axial plane intersects the central region.

In a variation of one or more of the above-described examples, the first terminals may be configured to carry only a majority of the information needed to determine an addressable memory location of a memory storage array of one or more microelectronic elements of the respective microelectronic package.

In another example, the first terminals of a microelectronic package of the assembly may be configured to carry at least three-quarters of the address information usable by the circuitry within the package to determine the addressable memory location.

Other structures are also possible. For example, a module can be provided which includes a circuit panel and a plurality of microelectronic packages mounted to, and electrically connected with the circuit panel through terminals of each microelectronic package for transport of signals to and from each microelectronic package. Each of the plurality of microelectronic packages of the module may each be in accordance with one or more of the examples described above.

In accordance with another aspect of the invention, a system can be provided which includes a microelectronic package and one or more other electronic components electrically connected with the microelectronic package. Each microelectronic package may be in accordance with one or more of the examples described above. The system may include a housing, and the microelectronic package and other electronic components may be assembled together with the housing. In a particular example, the system may include a second microelectronic package in accordance with one or more of the examples described above.

BRIEF DESCRIPTION OF THE DRAWINGS

FIG. 6B is a plan view of the microelectronic element of FIG. 6A illustrating an arrangement of contacts in accordance with the embodiment shown in FIGS. 5 and 6A.

FIG. 6C is a plan view illustrating an alternative arrangement of contacts on a microelectronic element according to a variation of the embodiment shown in FIG. 6B.

FIG. 7C is a schematic diagram illustrating a microelectronic assembly including a circuit panel and microelectronic packages electrically connected thereto, e.g., a memory module, among others, according to an embodiment of the invention.

FIG. 14B is a plan view further illustrating an arrangement of terminals in accordance with the embodiment shown in FIG. 14A.

DETAILED DESCRIPTION

Figure 1:
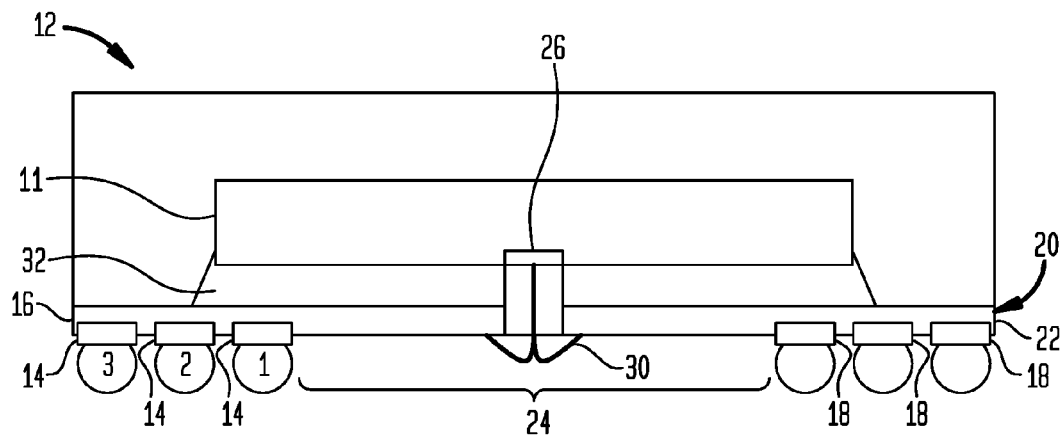
FIG. 1 is a sectional view illustrating a conventional microelectronic package containing a DRAM chip.

In view of the illustrative conventional microelectronic package 12 described relative to FIG. 1, the inventors have recognized improvements which can be made that may help improve the electrical performance of a microelectronic package incorporating a memory storage array chip, and a microelectronic assembly that incorporates such microelectronic package.

Figure 2:
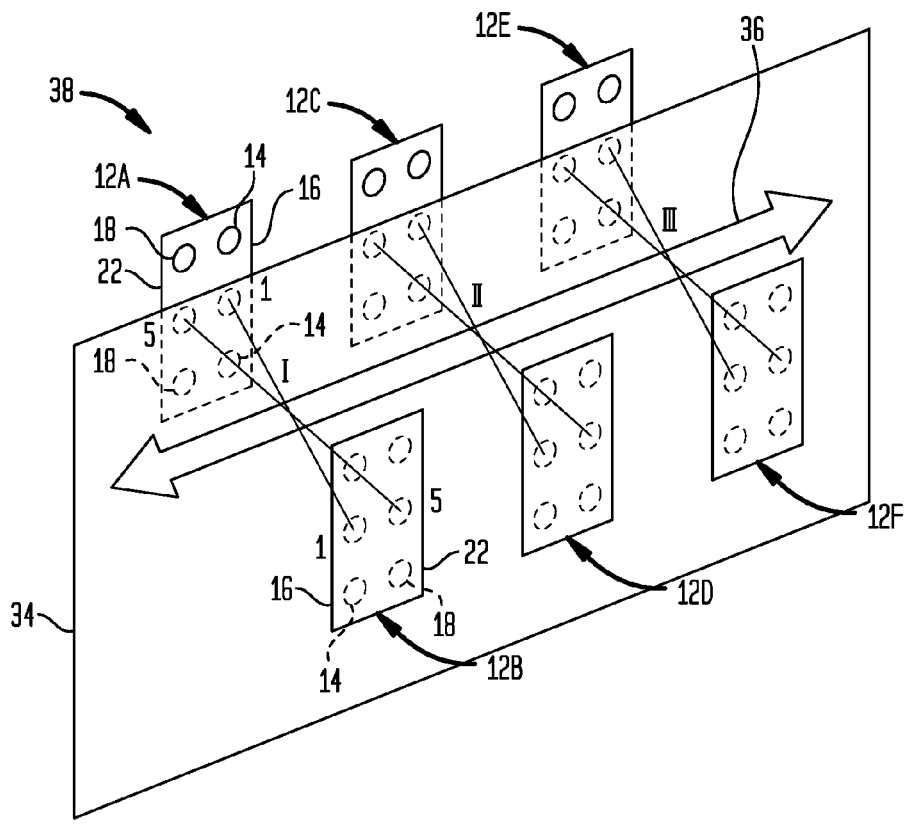
FIG. 2 is a diagrammatic schematic diagram illustrating a microelectronic assembly, e.g., a DIMM module, incorporating a circuit panel and a plurality of microelectronic packages mounted opposite one another to first and second opposite surfaces thereof.
Figure 3:
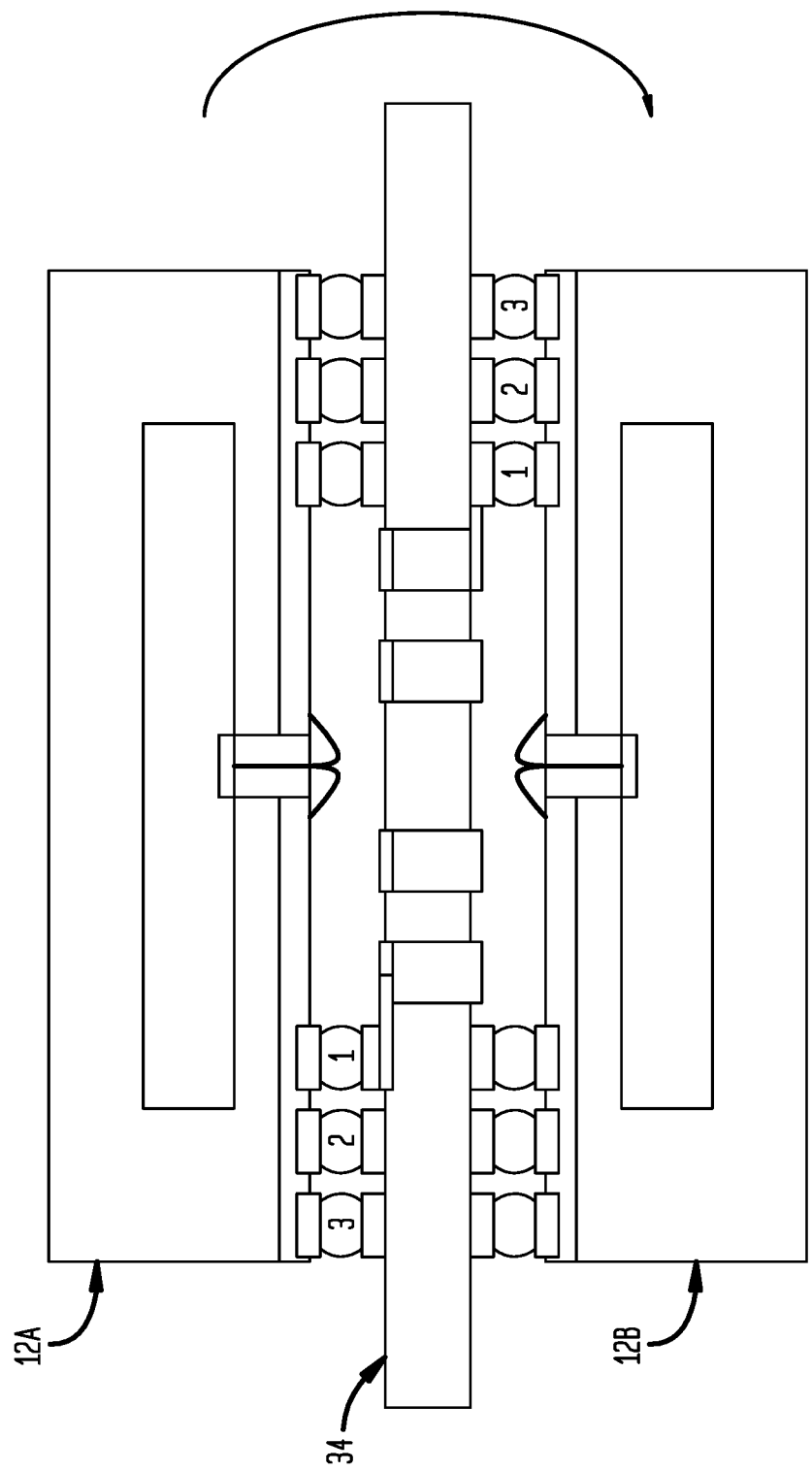
FIG. 3 is a sectional view further illustrating an electrical interconnection between first and second microelectronic packages and a circuit panel in an assembly such as shown in FIG. 2.
Figure 4:
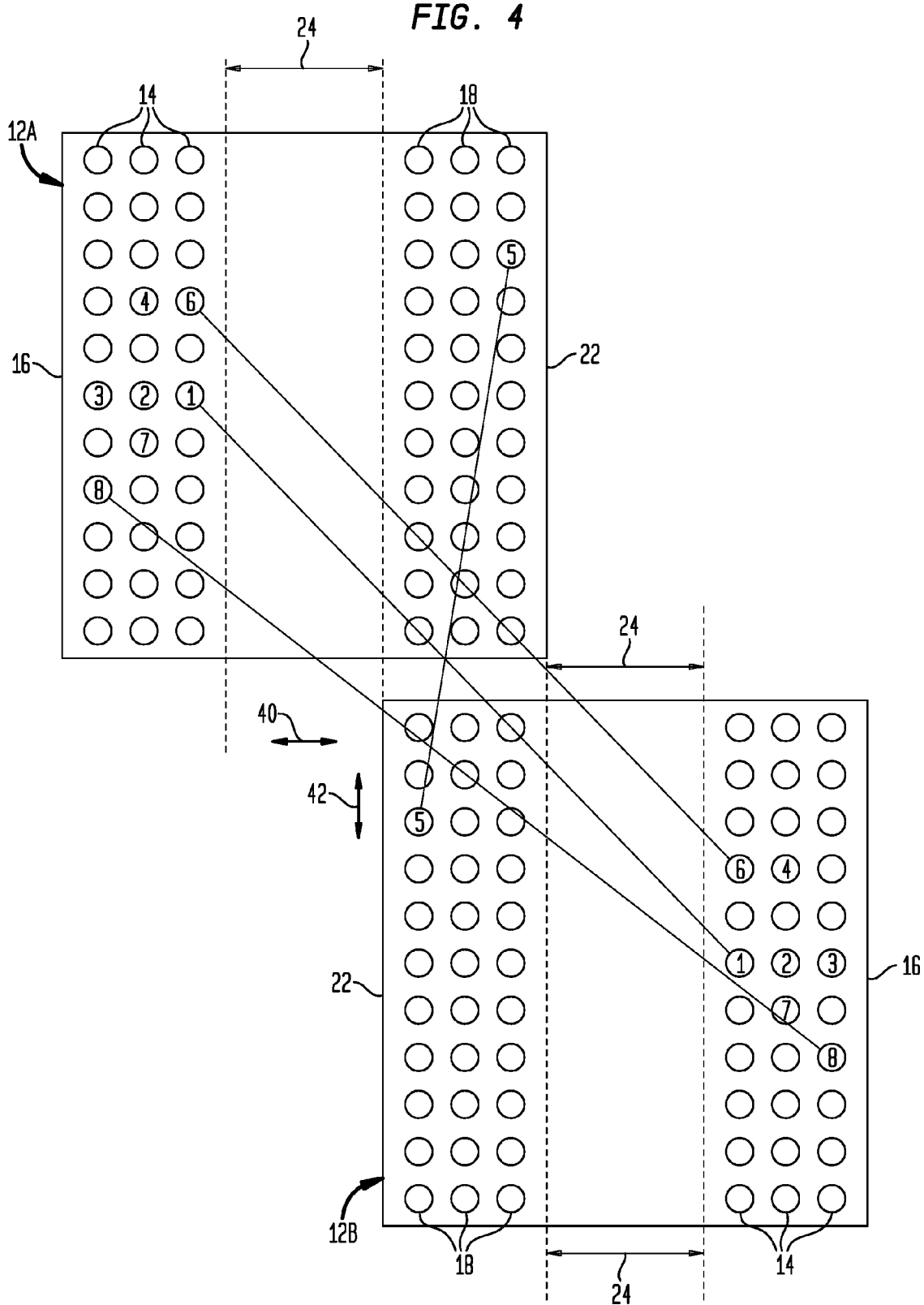
FIG. 4 is a diagrammatic plan view further illustrating the electrical interconnection between first and second microelectronic packages in an assembly such as shown in FIG. 2.

Improvements can be made particularly for use of a microelectronic package when provided in an assembly such as shown in FIGS. 2-4, in which a package 12A is mounted to a surface of a circuit panel with another like package 12B mounted opposite thereto on an opposite surface of the circuit panel. The packages 12A, 12B typically are functionally and mechanically equivalent to one another. Other pairs 12C and 12D; and 12E and 12F, of functionally and mechanically equivalent packages typically are also mounted to the same circuit panel 34. The circuit panel and the packages assembled thereto may form a portion of an assembly commonly referred to as a dual in-line memory module ("DIMM"). The packages in each oppositely mounted pair of packages, e.g., packages 12A, 12B, connect to contacts on opposite surfaces of the circuit panel so that the packages in each pair overlie one another typically by more than 90% of their respective areas. Local wiring within the circuit panel 34 connects terminals, e.g., the terminals labeled "1" and "5" on each package to global wiring on the circuit panel. The global wiring includes the signal conductors of a bus 36 used to conduct some signals to connection sites on the circuit panel 34 such as sites I, II and III. For example, the packages 12A, 12B are electrically connected to the bus 36 by local wiring coupled to a connection site I, packages 12C, 12D are electrically connected to the bus by local wiring coupled to connection site II, and packages 12E, 12F are electrically connected to the bus by local wiring coupled to connection site lit.

The circuit panel 34 electrically interconnects the terminals of the respective packages 12A, 12B using local interconnect wiring that appears similar to a crisscross or "shoelace" pattern in which a terminal labeled "1" near one edge 16 of package 12A connects through the circuit panel 34 to a terminal labeled "1" of package 12B near the same edge 16 of package 12B. However, the edge 16 of package 12B as assembled to circuit panel 34 is far from the edge 16 of package 12A. FIGS. 2-4 further shows that a terminal labeled "5" near an edge 22 of package 12A is connected through the circuit panel 34 to a terminal labeled "5" of package 12B near the same edge 22 of package 12B. In assembly 38 the edge 22 of package 12A is far from the edge 22 of package 12B.

Connections through the circuit panel between terminals on each package, e.g., package 12A, to the corresponding terminals on the package mounted opposite thereto, i.e., package 12B, are fairly long. As further seen in FIG. 3, in such assembly of like microelectronic packages 12A, 12B, the circuit panel 34 may electrically interconnect a signal conductor of the bus 36 with the terminal of package 12A marked "1" and the corresponding terminal of package 12B marked "1", when the same signal from the bus is to be transmitted to each package. Similarly, the circuit panel 34 may electrically interconnect another signal conductor of the bus 36 with the terminal of package 12A marked "2" and the corresponding terminal of package 12B marked "2". The same connection arrangement may also apply to other signal conductors of the bus and corresponding terminals of each package.

Local wiring between the bus 36 on the circuit panel 34 and each package of the respective pair of packages, e.g., packages 12A, 12B (FIG. 2) at a connection site I of the board can be in form of unterminated stubs. Such local wiring when relatively long may in some cases impact the performance of the assembly 38 as discussed below. Moreover, the circuit panel 34 also requires local wiring to electrically interconnect certain terminals of other packages: the pair of packages 12C and 12D, and the pair of packages 12E and 12F to the global wiring of the bus 36, and such wiring can also impact the performance of the assembly in the same way.

FIG. 4 further illustrates the interconnection between microelectronic packages 12A, 12B of respective pairs of terminals assigned to carry signals "1", "2", "3", "4", "5", "6", "7", and "8". As seen in FIG. 4, because the columns 14, 18 of terminals are near the edges 16, 22, respectively, of each package 12A, 12B, the wiring needed to traverse the circuit panel 34 in a direction 40 transverse to the direction 42 in which the columns 14, 18 of terminals extend can be quite long. In recognition that the length of a DRAM chip can be in the range of ten millimeters on each side, the length of the local wiring in a circuit panel 34 in an assembly 38 seen in FIGS. 2-4 that is required to route the same signal to the corresponding terminals of two oppositely mounted packages 12A, 12B can range between five and ten millimeters and may typically be about seven millimeters.

In some cases, relatively long unterminated wiring on a circuit panel which connects the terminals of a package may not severely impact the electrical performance of the assembly 38. However, when a signal is transferred from a bus 36 of the circuit panel to each of multiple pairs of packages connected to the circuit panel as shown in FIG. 2, the inventors recognize that the electrical lengths of the stubs, i.e., the local wiring, that extend from the bus 36 to the terminal connected thereto on each package potentially impacts the performance of the assembly 38. Signal reflections on the unterminated stubs can travel in the reverse direction from the connected terminals of each package back onto the bus 36, and thus degrade the signals being transferred from the bus 36 to the packages. The impacts may be tolerable for some packages containing microelectronic elements of current manufacture. However, in present or future assemblies which operate with increased signal switching frequencies, low voltage swing signals or both, the inventors recognize that the impacts can become severe. For these assemblies, settling time, ringing, jitter, or intersymbol interference of a transmitted signal may increase to an unacceptable degree.

The inventors further recognize that the electrical lengths of the unterminated stubs are usually longer than the local wiring that connects the bus 36 on the circuit panel with the terminals of the packages mounted thereto. Unterminated wiring within each package from the package terminals to the semiconductor chip therein adds to the lengths of the stubs.

In a specific example, the bus 36 is a command-address bus of an assembly having a predominant memory storage array function such as a DIMM. The command-address bus 36 can be configured to carry address information transferred to the microelectronic packages that is usable by circuitry within the packages, e.g., row address and column address decoders, and bank selection circuitry, if present, to determine an addressable memory location from among all the available addressable memory locations of a memory storage array within a microelectronic element in the packages. The command-address bus 36 can be configured to carry the above-noted address information to connection sites, e.g., sites I, II, and III shown in FIG. 2. These above-noted address information can then be distributed by local wiring to respective sets of panel contacts on opposite surfaces of the circuit panel, to which packages 12A, 12B, 12C, 12D, 12E and 12F are connected.

In a particular example, when the microelectronic element is or includes a DRAM chip, command-address bus 36 can be configured to carry all of a group of signals of a command-address bus of the microelectronic element, i.e., command signals, address signals, bank address signals and clock signals that are transferred to the microelectronic packages, wherein the command signals include write enable, row address strobe, and column address strobe signals, and the clock signals are clocks used for sampling the address signals. While the clock signals can be of various types, in one embodiment, the clock signals carried by these terminals can be one or more pairs of differential clock signals received as differential or true and complement clock signals.

Accordingly, certain embodiments of the invention described herein provide a microelectronic package configured so as to permit the lengths of stubs to be reduced when first and second such packages are mounted opposite one another on opposite surfaces of a circuit panel, e.g., a circuit board, module board or card, or flexible circuit panel. Assemblies which incorporate first and second microelectronic packages mounted opposite one another on a circuit panel can have significantly reduced stub lengths between the respective packages. Reducing the stub lengths within such assemblies can improve electrical performance, such as by reducing one or more of settling time, ringing, jitter, or intersymbol interference, among others. Moreover, it may be possible to obtain other benefits as well, such as simplifying the structure of the circuit panel or reducing the complexity and cost of designing or manufacturing the circuit panel, or for both designing and manufacturing the circuit panel.

Figure 5:
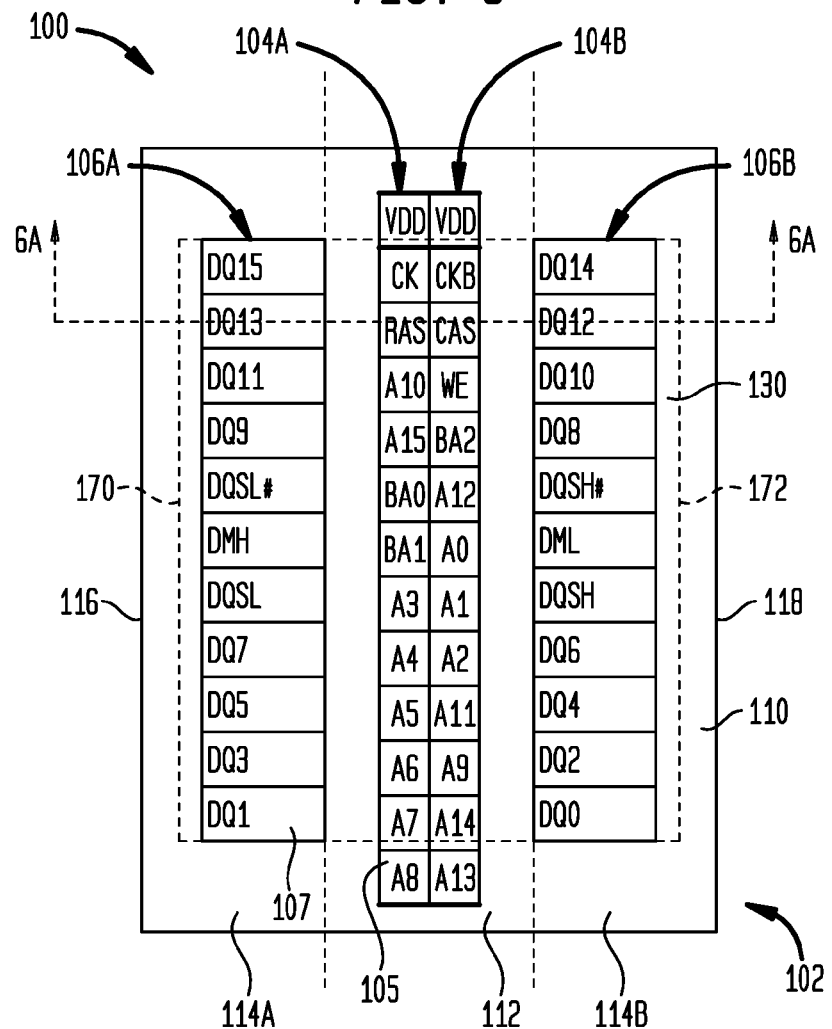
FIG. 5 is a diagrammatic plan view illustrating an arrangement and signal assignment of terminals in a microelectronic package according to an embodiment of the invention.

Thus, a microelectronic package 100 according to an embodiment of the invention is illustrated in FIGS. 5 through 6B. As seen therein, the package can include a substrate 102 on which a plurality of columns 104A, 104B are disposed, each column 104A and 104B having at least some first terminals 105 disposed within the column. Optionally, a plurality of columns 106A, 106B are also disposed on the substrate 102, each column 106A and 106B having second terminals 107 disposed within the column.

As used herein, a statement that an electrically conductive element such as a terminal, or a contact, is "on" or "disposed on" a supporting element such as a substrate of a package or a circuit panel does not require that the electrically conductive element overlie a surface of the supporting element, so long as the electrically conductive element is available at the surface of the supporting element for contact with a theoretical point moving in a direction perpendicular to the surface of the supporting element. Thus, the terminal or contact may project above the surface, be recessed relative to the surface, or be flush with the surface.

The substrate may include a dielectric element, which in some cases can consist essentially of polymeric material, e.g., a resin or polyimide, among others, and which may be sheet-like. Alternatively, the substrate 102 can include a dielectric element having a composite construction such as glass-reinforced epoxy, e.g., of BT resin or FR-4 construction. In another example, the substrate can include a supporting element of material having a coefficient of thermal expansion ("CTE") of less than 12 parts per million per degree Celsius ("ppm/° C."), on which the terminals and other conductive structure are disposed. For example, such low CTE element can consist essentially of glass, ceramic or semiconductor material or liquid crystal polymer material, or a combination of such materials.

The terminals 105 and 107 can be disposed at positions within a plurality of columns 104A, 104B, 106A and 106B exposed at a surface 110 of the substrate. As used herein, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure. In the example shown in FIG. 5, columns 104A and 104B each extend in a first direction along the surface 110 and includes a plurality of first terminals 105. Columns 106A, 106B may each include a plurality of second terminals 107 and may in some cases be parallel with the columns 104A, 104B and extend in the first direction as well. In a particular example, some second terminals can also be disposed within columns 104A, 104B. The central region 112 is not wider than three and one-half times a minimum pitch between adjacent ones of the parallel columns of the terminals, as seen and further described relative to FIG. 7A below.

In one example, the first terminals can be configured to carry address information usable by circuitry within the package to determine an addressable memory location from among all the available addressable memory locations of a memory storage array within the microelectronic element. Thus, in one embodiment, the first terminals are configured to carry address information transferred to the microelectronic package which is usable by circuitry within the package, e.g., row address and column address decoders, and bank selection circuitry, if present, to determine an addressable memory location from among all the available addressable memory locations of a memory storage array within a microelectronic element in the package. Typically, the address information carried by the first terminals is sufficient to determine the addressable memory location. In a particular embodiment, the first terminals can be configured to carry all the address information used by such circuitry within the package to determine an addressable memory location within such memory storage array.

In a variation of such embodiment, the first terminals can be configured to carry a majority of the address information that is used by such circuitry within the package to determine an addressable memory location within such memory storage array, and then other terminals such as the above-referenced second terminals on the package would then be configured to carry the remaining part of the address information. In such variation, in a particular embodiment, the first terminals are configured to carry three quarters or more of the address information that is used by such circuitry within the package to determine an addressable memory location within such memory storage array.

In a particular embodiment, the first terminals may not be configured to carry chip select information, e.g., information usable to select a particular chip within the package for access to a memory storage location within the chip. In another embodiment, the first terminals may indeed carry chip select information.

A variety of microelectronic elements, e.g., semiconductor chips, are configured to provide memory storage array function. In one example, a microelectronic element may contain a greater number of active devices to provide memory storage array function than any other function. In one type of such microelectronic element, each one of some contacts of a plurality of external contacts at an exterior of the microelectronic element is dedicated to receiving a respective address signal of a plurality of address signals supplied to the microelectronic element. In this case, each of such contacts is able to receive one address signal of the plurality of address signals supplied to the microelectronic element from an external component, e.g., from a circuit panel via connections through a microelectronic package in which the microelectronic element is incorporated.

In one particular example of this type of microelectronic element, each of the plurality of address signals present at the external contacts can be sampled relative to an edge of a clock used by the microelectronic element, i.e., upon on a transition of the clock between first and second different voltage states. That is, each address signal can be sampled upon a rising transition between a lower voltage state and a higher voltage state of the clock, or upon a falling transition between a higher voltage state and a lower voltage state of the clock. Thus, the plurality of address signals may all be sampled upon the rising transition of the clock, or may all be sampled upon the falling transition of the clock, or in another example, the address signal at one of the external contacts can be sampled upon the rising transition of the clock and the address signal at one other external contact can be sampled upon the falling transition of the clock.

In another type of microelectronic element configured to predominantly provide memory storage array function, one or more of the address contacts thereon can be used in a multiplexed manner. In this example, a particular external contact of the microelectronic element can be configured to receive two or more different signals supplied to the microelectronic element from the outside. Thus, a first address signal can be sampled at the particular contact upon a first transition of the clock between the first and second different voltage states (e.g., a rising transition), and a signal other than the first address signal can be sampled at the particular contact upon a second transition of the clock (e.g., a falling transition) between the first and second voltage states that is opposite the first transition.

In such a multiplexed manner, two different signals can be received within the same cycle of the clock on the same external contact of the microelectronic element. In a particular case, multiplexing in this manner can allow a first address signal and a different signal to be received in the same clock cycle on the same external contact of the microelectronic element. In yet another example, multiplexing in this manner can allow a first address signal and a second different address signal to be received in the same clock cycle on the same external contact of the microelectronic element.

In a particular example, the first terminals can be configured to carry all of a group of command signals, address signals, bank address signals and clock signals which are transferred to the microelectronic package. As mentioned above, the "command signals" are a write enable signal, row address strobe signal, and column address strobe signal utilized by a microelectronic element within the microelectronic package, when such microelectronic element is a dynamic random access memory storage device. "Clock signals" are signals used as clocks for sampling the address signals. For example, as seen in FIG. 5, the first terminals can include clock signals CK and CKB, row address strobe RAS, column address strobe CAS and write enable signals WE, as well as address signals A0 through A15 inclusive, and bank address signals BA0, BA1 and BA2.

Although not specifically shown in FIG. 5, other terminals, e.g., second terminals, can also be disposed in the central region and be configured to carry other signals, e.g., data signals to and or from the microelectronic element of the package. Although some first terminals in FIG. 5 are assigned for carrying a power supply voltage (VDD), the power supply connections as well as connections to ground can be among any of the first or second terminals. For ease and clarity of description, the terminals used for connecting to a power supply or to ground are omitted from the drawings and need not be mentioned further in the description which follows.

Typically, when the microelectronic package has second terminals, the second terminals are arranged in one or more columns each having a plurality of second terminals. The second terminals 106A, 106B may be arranged in one or more of first and second peripheral regions 114A, 114B of the second surface 110 of the substrate 102, the peripheral regions 114A, 114B being adjacent to first and second opposed edges 116, 118 of the second surface 110. The central region 112 can be disposed between the first and second peripheral regions 114A, 114B.

Figure 6A:
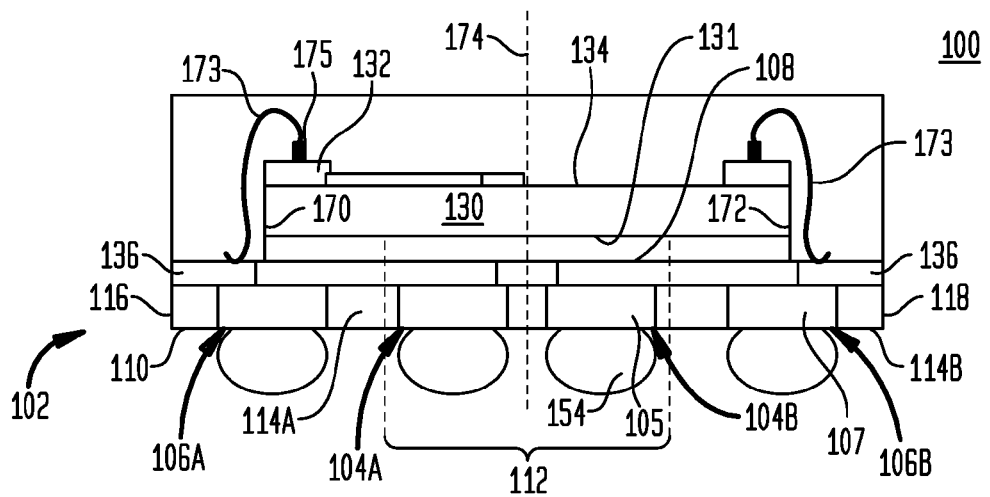
FIG. 6A is a sectional view through line 6A-6A of FIG. 5 further illustrating the microelectronic package shown in FIG. 5.

As seen in the sectional view of FIG. 6A, a microelectronic element 130 within microelectronic package 100 has a rear face 131 facing the second surface 110 of the substrate 102, and a front face 134 opposite the rear face 131, and first and second opposed edges 170, 172 extending between the front and rear faces. The microelectronic element, e.g., a semiconductor chip, or stacked arrangement of semiconductor chips, can be configured to provide memory storage array function, and in one example, may be configured to predominantly provide memory storage array function. In such microelectronic element, the number of active devices, e.g., transistors, therein which are configured, i.e., constructed and interconnected with other devices, to provide memory storage array function may be greater than the number of active devices which are configured to provide any other function.

Thus, in one example, a microelectronic element such as a DRAM chip may have memory storage array function as its primary or sole function. Alternatively, in another example, such microelectronic element may have mixed use and may incorporate active devices configured to provide memory storage array function, and also incorporate other active devices configured to provide another function such as processor function, or signal processor or graphics processor function, among others. In this case, the microelectronic element may in some cases still have a greater number of active devices configured to provide the memory storage array function than any other function of the microelectronic element.

An axial plane 174 normal to the face 134 of the microelectronic element 130 intersects the second surface 110 of the substrate 102 along a line which extends in the first direction and is parallel to and centered with respect to the first and second edges 170, 172 of the microelectronic element 130. As further seen in FIG. 6A and in a corresponding plan view of FIG. 6B, an edge 170 of microelectronic element 130 extends in the first direction 142 and a column 138 of contacts 132 exposed at the front face 134 of the microelectronic element and adjacent to edge 170 can extend in the same first direction 142 along the front face 134. Another edge 172 of microelectronic element 130, parallel to edge 170, extends in the first direction 142 and a second column 139 of contacts 132 exposed at the front face 134 of the microelectronic element may extend in the same first direction 142 along the front face 134 adjacent to edge 172. As further shown in FIG. 6B, a column of contacts on the microelectronic element can be fully populated as in the case of column 138, or a column of contacts may have only have contacts at some of the positions within the column, as in the case of column 139. Conductive structure such as wire bonds 173 (FIG. 6A) may electrically connect the contacts 132 with corresponding contacts 136 on a first surface 108 of the substrate.

Referring to FIG. 6A, the axial plane 174 of microelectronic element 130, extending in the first direction parallel to edges 170, 172, intersects the central region 112 of the second surface 110 of the substrate, the central region 112 of the substrate surface being where at least a first column 104A and a second column 104B of terminals, each having at least some first terminals 105 are disposed within the column of the microelectronic package. Second terminals, if present, may be disposed in one or more of the peripheral regions 114A, 114B of the substrate surface 110. Alternatively or in addition thereto, one or more second terminals may be disposed in the central region, such as can be disposed within columns 104A, 104B. As further seen in FIG. 6A, joining elements 154 attached to terminals can include a bond metal, e.g., solder, tin, indium or eutectic, or other electrically conductive bond material attached to the terminals that can be used to join the terminals of the package 100 to a component external to the package, such as to corresponding contacts of a circuit panel.

FIG. 6C illustrates a variation of the embodiment shown in FIG. 6B in which the contacts 132 of a microelectronic element 180 exposed at the front face thereof are disposed in columns or rows adjacent to and aligned with respective peripheral edges 170, 172, 176, 178 of the microelectronic element 180. Edges 170, 172 are parallel and extend in a first direction 142. FIG. 6C illustrates the location of an axial plane 174 of the microelectronic element 180. In such variation, the axial plane 174 is shown to extend in the first direction and is centered among the parallel edges 170, 172.

Figure 6D:
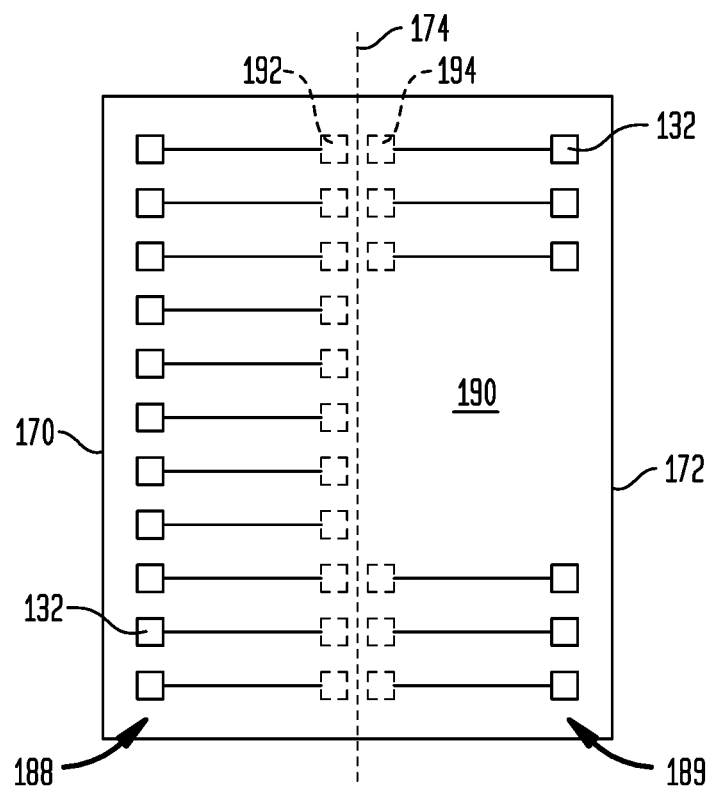
FIG. 6D is a plan view illustrating another alternative arrangement of contacts on a microelectronic element according to a variation of the embodiment shown in FIG. 6B.

FIG. 6D illustrates another variation of the embodiment shown in FIG. 6B in which the contacts of a microelectronic element 190 are disposed in columns 188 and 189 adjacent to edges 170, 172 of the microelectronic element. However, in this case, the microelectronic element 190 includes a semiconductor chip having a conductive redistribution layer thereon, and the contacts 132 can include redistribution contacts which are connected to the contacts 192, 194 of the semiconductor chip by conductive traces, or metalized vias formed in contact with the contacts 192, 194 of the semiconductor chip (or which can be connected to the contacts 192 194 of the chip by both metalized vias and traces). In this example, the axial plane 174 intersects the face 196 of the microelectronic element along a line centered among the columns of 188, 189 of redistribution contacts.

Figure 6E:
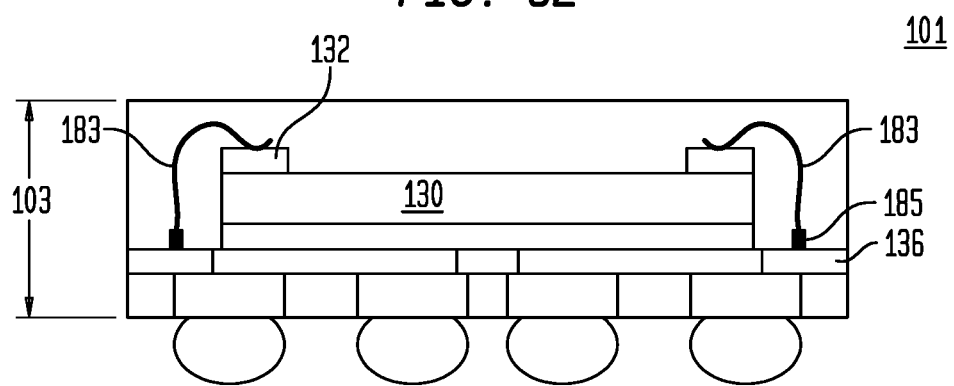
FIG. 6E is a sectional view illustrating a microelectronic package according to a variation of the embodiment shown in FIGS. 5 and 6A.

In the package 100 as shown in FIG. 6A, the wire bonds 173 electrically connecting the microelectronic element 130 with the substrate 102 may be formed starting from the microelectronic element 130, in which case the wire bond forms a ball 175 on the contact 132 of the microelectronic element and is wedge-bonded to the corresponding substrate contact 136. FIG. 6E shows a package 101 according to a variation thereof in which the wire bond 183 forms a ball 185 on the contact 136 of the substrate and is wedge-bonded to the corresponding contact 132 of the microelectronic element 130. The variation of FIG. 6E may be employed if desired to reduce a height 103 of the microelectronic package 101, as the wire bonds 183 formed in this way can generally have lower height excursion above the contacts 132 than the wire bonds 173 shown in FIG. 6A.

Figure 7A:
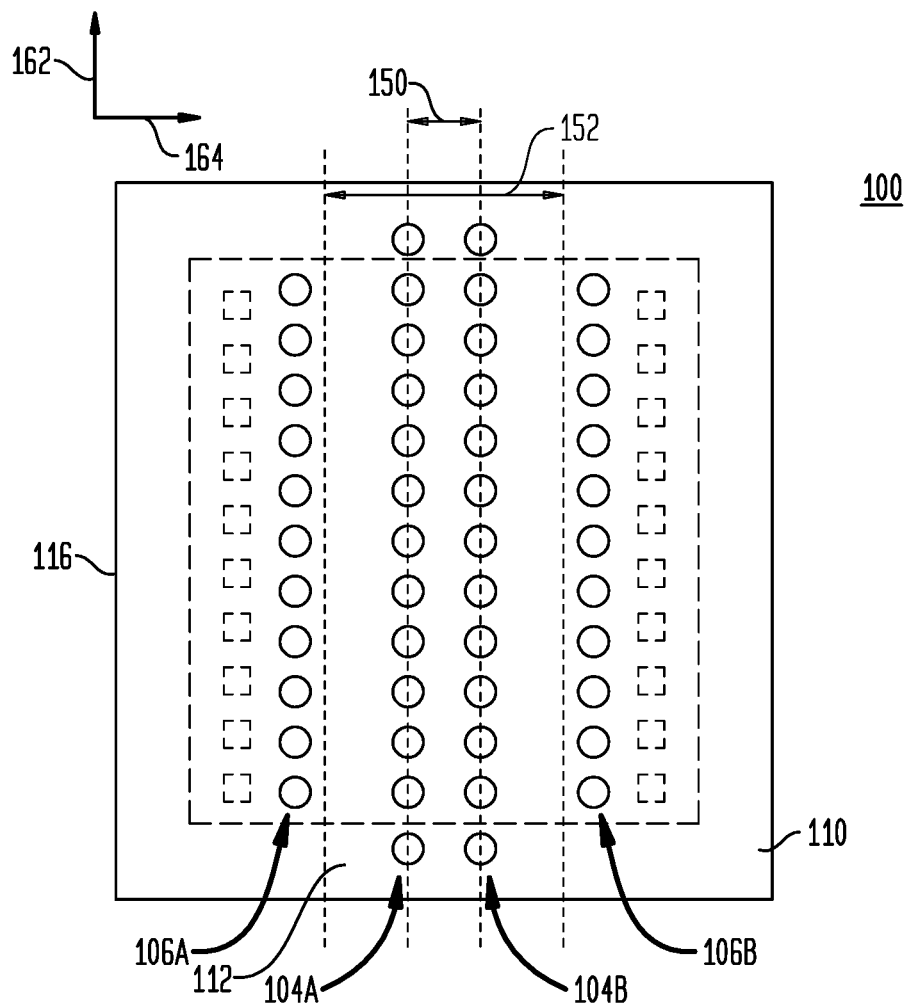
FIG. 7A is a plan view further illustrating an arrangement of terminals in accordance with the embodiment shown in FIGS. 5 and 6A.

FIG. 7A is a plan view of the package 100 looking toward a terminal-bearing surface 110 of the substrate therein. Columns 104A, 104B in which first terminals are disposed can lie within a central region 112 of the surface 110, and columns 106A, 106B in which second terminals are disposed can lie within one or more peripheral regions 114A, 114B of the surface 110. The smallest distance between any two adjacent columns of terminals on the substrate is the minimum pitch 150 as shown in FIG. 7A. The minimum pitch is in a direction 164 perpendicular to the direction 162 in which the terminals in a particular column, e.g., column 104A are arranged. In the example shown in FIG. 7A, the minimum pitch 150 occurs between columns 104A, 104B which are closest to one another. With continued reference to FIG. 7A, the central region 112 has a width 152 along the substrate surface 110 in the direction 164 of the pitch. In a particular example, the width 152 may be not greater than three and one-half times the minimum pitch 150 between any two adjacent columns of the terminals, i.e., not more than three and one-half times the minimum pitch 150 between the closest adjacent columns 104A, 104B.

Figure 7B:
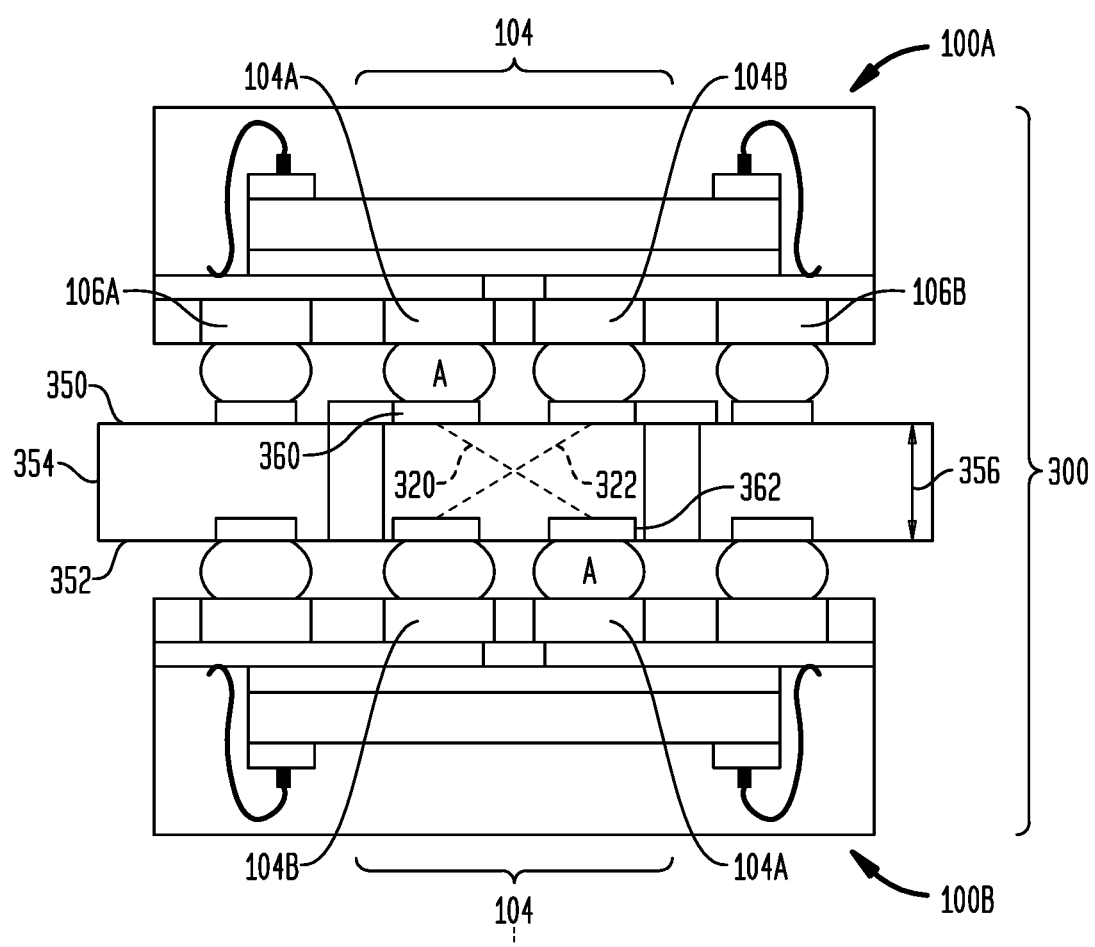
FIG. 7B is a sectional view illustrating a microelectronic assembly and first and second microelectronic packages electrically interconnected therewith in accordance with an embodiment of the invention.

FIG. 7B illustrates a microelectronic assembly 300 of a circuit panel 354 and first and second microelectronic packages 100A, 100B, each being a microelectronic package 100 having a structure according to one or more of the embodiments described above relative to FIGS. 5-6E. Referring to FIG. 7A, each package 100A, 100B may have the same signals assigned to the respective locations of terminals on the package, and the columns 104A, 104B, 106A, 106B of terminals on each package can be arranged at the same locations in x and y orthogonal directions 164, 162 relative to an edge 116 of the substrate. The packages 100A, 100B are electrically connected to contacts 360, 362, respectively, exposed at first and second opposite surfaces 350, 352 of the circuit panel 354, respectively.

The circuit panel can be of various types, such as a printed circuit board used in a dual inline memory module ("DIMM") module, a circuit board or panel to be connected with other components in a system, or a motherboard, among others. In a particular embodiment, the circuit panel may include an element having a coefficient of thermal expansion ("CTE") of less than 12 parts per million per degree Celsius ("ppm/° C."), wherein the panel contacts at the first and second surfaces are connected by vias extending through the element. For example, the element may consist essentially of semiconductor, glass, ceramic or liquid crystal polymer material.

In the example shown in FIG. 7B, the first terminals 105 in the columns 104A, 104B can be disposed at positions within a grid 104 on the first package 100A, and the first terminals 105 in the columns 104A, 104B on the second package 100B can be disposed at positions of within a similar grid 104. Each grid of terminals may be fully populated, i.e., having a terminal at each position of each grid. Alternatively, there may not be a terminal disposed at one or more positions of the grid on a package. As apparent from FIG. 7B, the grids 104 which include first terminals on each package 100A, 100B can be aligned within a distance of one ball pitch of one another in x and y orthogonal directions parallel to the surface 350 of the circuit panel, the ball pitch being no greater than a minimum pitch between any two adjacent parallel columns of the terminals on either package. In a particular example, the grids 104 may be coincident with one another. As used herein, when grids of terminals of packages at opposite surfaces of a circuit panel are "coincident" with one another, the alignment can be within customary manufacturing tolerances or can be within a tolerance of less than one-half of one ball pitch of one another in x and y orthogonal directions parallel to the first and second circuit panel surfaces, the ball pitch being as described above.

Wiring within the circuit panel 354 electrically connects the terminals in column 104A of package 100A with terminals in column 104A of package 100B, as shown. The wiring that forms the electrical connections is shown schematically by the dashed line 320 in FIG. 7B, since the wiring can be hidden from view in the example shown in FIG. 7B. Similarly, wiring within the circuit panel 354 electrically connects the terminals in column 104B of package 100A with terminals in column 104B of package 100B, and the electrical interconnections between such terminals is shown schematically by the dashed line 322 in FIG. 7B.

Further, in a particular example as shown in FIG. 7B, since there are two columns 104A, 104B of first terminals in each grid, and the grids are aligned within at least one ball pitch of one another, then the wiring on the circuit panel 354 required to connect one of the first terminals labeled "A" of package 100A with a corresponding one of the first terminals labeled "A" of package 100B can be relatively short. Specifically, when each grid 104 on each package has two columns 104A, 104B, and the grids 104 are aligned in the above-described manner, then a terminal of the first column 104A of the first package 100A is aligned within one ball pitch of a terminal of the second column 104B of the second package 100B in x and y orthogonal directions parallel to the first surface 350 of the circuit panel, the first surface 350 being a major surface of the circuit panel. In addition, a terminal of the second column 104B of the first package 100A is aligned within one ball pitch of a terminal of the first column 104A of the second package in x and y orthogonal directions parallel to the first surface 350 of the circuit panel.

Therefore, the electrical lengths of stubs on the circuit panel 354 that electrically connect a first terminal of the first column of package 100A with the corresponding first terminal of the first column of the second package 100B can be less than seven times a minimum pitch of the first terminals on each package: for example, less than seven times the pitch 150 between columns 104A, 104B of first terminals in FIG. 7A. Stated another way, the total combined length of the conductive elements connecting a pair of electrically coupled first and second panel contacts 360, 362 exposed at the first and second surfaces of the circuit panel to the corresponding conductor of the bus 36 on the circuit panel can be less than seven times a smallest pitch of the panel contacts.

In another example, the total combined length of the conductive elements connecting a pair of electrically coupled first and second panel contacts 360, 362 may be approximately the same as a thickness 356 of the circuit panel 354 between first and second surfaces 350, 352. In yet another example, the electrical length of the connection between a first terminal in column 104A of the first package 100A with the corresponding first terminal in column 104A on the second package 100B may be approximately the same as the thickness 356 of the circuit panel 354.

The reductions in the lengths of these electrical connections can reduce stub lengths from bus 36 (FIG. 2) on the circuit panel to the connection sites of the packages thereon. The reduced stub lengths can improve electrical performance, such as by reducing one or more of settling time, ringing, jitter, or intersymbol interference, among others, for the above-noted signals of the bus 36.

Moreover, it may be possible to obtain other benefits as well, such as simplifying the structure of the circuit panel 354 or reducing the complexity and cost of designing or manufacturing the circuit panel. That is, connections on the circuit panel may require fewer layers of wiring to interconnect first terminals of each package to routing layers within the circuit panel which constitute a set of conductors which carry the address information or carry the address information and other information as described above.

In addition, the number of global routing layers of wiring on the circuit panel needed to implement a bus 36 such as used to transmit the above-noted address information or command and address information as described above can also be reduced when the microelectronic packages attached thereto are constructed according to the principles herein. Specifically, the number of required routing layers may in some cases be reduced to two or fewer routing layers. In a particular example, there may be no more than one routing layer for routing of the above-noted address information, or for routing of all above-noted command signals, address signals, bank address signals, and clock signals of a command-address bus 36. However, on the circuit panel, there may be a greater number of routing layers which carry information other than the above-noted address information or carry signals other than the command-address bus signals.

In a particular example in which the first terminals of each microelectronic package are disposed at positions within a single column of the grid 104 of the respective microelectronic package, the circuit panel 354 may include no more than one routing layer for global routing of all of the address information between a connection site on the circuit panel at which the terminals of the first and second microelectronic packages 100A, 100B are electrically connected and a different connection site at which the terminals of at least a third microelectronic package are electrically connected.

In one embodiment in which the first terminals of each microelectronic package are disposed at positions within no more than two parallel columns of the grid 104 of the respective microelectronic package, the circuit panel 354 may include no more than two routing layers for global routing of all of the address information between a connection site on the circuit panel at which the terminals of the first and second microelectronic packages 100A, 100B are electrically connected and a different connection site at which the terminals of at least a third microelectronic package are electrically connected. In a particular example, in such an embodiment, there may be no more than one routing layer for the above-noted global routing.

FIG. 7C illustrates a microelectronic assembly such as, for example, a DIMM, among others, incorporating a circuit panel and a plurality of microelectronic packages mounted opposite one another to first and second opposite surfaces thereof. As seen in FIG. 7C, the above-noted address signals or command-address bus signals can be routed on a bus 36, e.g., an address bus or command-address bus on the circuit panel or circuit board 354 in at least one direction 143 between connection sites I, II or III at which respective pairs of microelectronic packages 100A, 110B are connected to opposite sides of the circuit panel. Signals of such bus 36 reach each pair of packages at the respective connection sites I, II or III at slightly different times.

The at least one direction 143 can be transverse or orthogonal to a direction 142 in which at least one column 138 of a plurality of contacts on at least one microelectronic element within each package 100A or 100B extends. In such way, the signal conductors of the bus 36 on (i.e., on or within) the circuit panel 354 can in some cases be spaced apart from one another in a direction 142 which is parallel to the at least one column 138 of contacts on a microelectronic element within a package 100A, or 100B connected to the circuit panel.

Such configuration, particularly when the first terminals 105 of each microelectronic package are arranged in one or more columns 104A, 104B extending in such direction 142, may help simplify the routing of signal conductors of one or more global routing layers on the circuit panel used to route the signals of the bus 36. For example, it may be possible to simplify routing of the command-address bus signals on a circuit panel when relatively few first terminals are disposed at the same vertical layout position on each package. Thus, in the example shown in FIG. 5, only two first terminals are disposed at the same vertical layout position on each package, such as the first terminals configured to receive address signals A3 and A1.

In an exemplary embodiment, the microelectronic assembly 354 can have a microelectronic element 358 that can include a semiconductor chip configured to perform buffering of at least some signals transferred to the microelectronic packages 100A, 100B of the assembly 354. The microelectronic element 358 can be configured predominantly to perform a logic function, such as a solid state drive controller, and one or more of the microelectronic elements 358 in the microelectronic packages 100A and 100B can each include memory storage elements such as nonvolatile flash memory.

The microelectronic element 358 can include a special purpose processor that is configured to relieve a central processing unit of a system such as the system 1500 (FIG. 18) from supervision of transfers of data to and from the memory storage elements included in the microelectronic elements 358. Such a microelectronic element 358 including a solid state drive controller can provide direct memory access to and from a data bus on a motherboard (e.g., the circuit panel 1502 shown in FIG. 18) of a system such as the system 1300. In a particular embodiment, the microelectronic element 358 can have a buffering function. Such a microelectronic element 358 can be configured to help provide impedance isolation for each of the microelectronic elements 358 with respect to components external to the microelectronic assembly 354.

In a particular embodiment, the first terminals 104 of the microelectronic package can be configured to carry information that controls an operating mode of the microelectronic element 101. More specifically, the first terminals can be configured to carry all of a particular set of command signals and/or clock signals transferred to the microelectronic package 100. In one embodiment, the first terminals 104 can be configured to carry all of the command signals, address signals, bank address signals, and clock signals transferred to the microelectronic package 100 from an external component, wherein the command signals include row address strobe, column address strobe and write enable. In such embodiment, the first chip can be configured to regenerate the information that controls the operating mode. Alternatively, or in addition thereto, the first chip can be configured to partially or fully decode the information that controls the operating mode of the microelectronic element. In such embodiment, each second chip may or may not be configured to fully decode one or more of address information, command information, or information that controls an operating mode of the microelectronic element.

Figure 8:
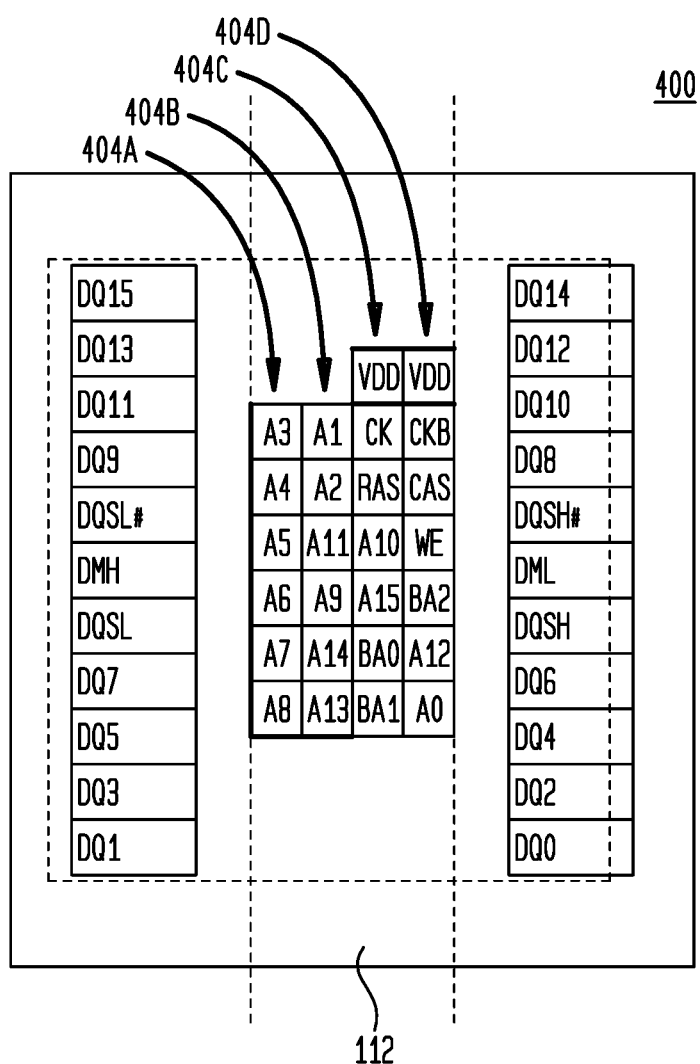
FIG. 8 is a plan view illustrating an alternative arrangement of terminals on a microelectronic package according to a variation of the embodiment shown in FIGS. 5 and 6A.

Microelectronic packages having other arrangements of terminals thereon can be provided. For example, in the microelectronic package 400 illustrated in FIG. 8, four columns 404A, 404B, 404C, and 404D of terminals are disposed in a central region 112 of the substrate surface, these columns containing the first terminals that are configured to carry the above-noted address information, or in a particular embodiment, are configured to carry all of the above-noted command signals, address signals, bank address signals and clock signals used to sample the address signals. In a particular example thereof, second terminals can also be disposed within the columns 404A, 404B, 404C, 404D, which are configured to carry information other than the above-noted information or signals carried by the first terminals. In another example (not shown), it is also possible for the first terminals of a microelectronic package to be disposed at positions within three columns of terminals.

Figure 9A:
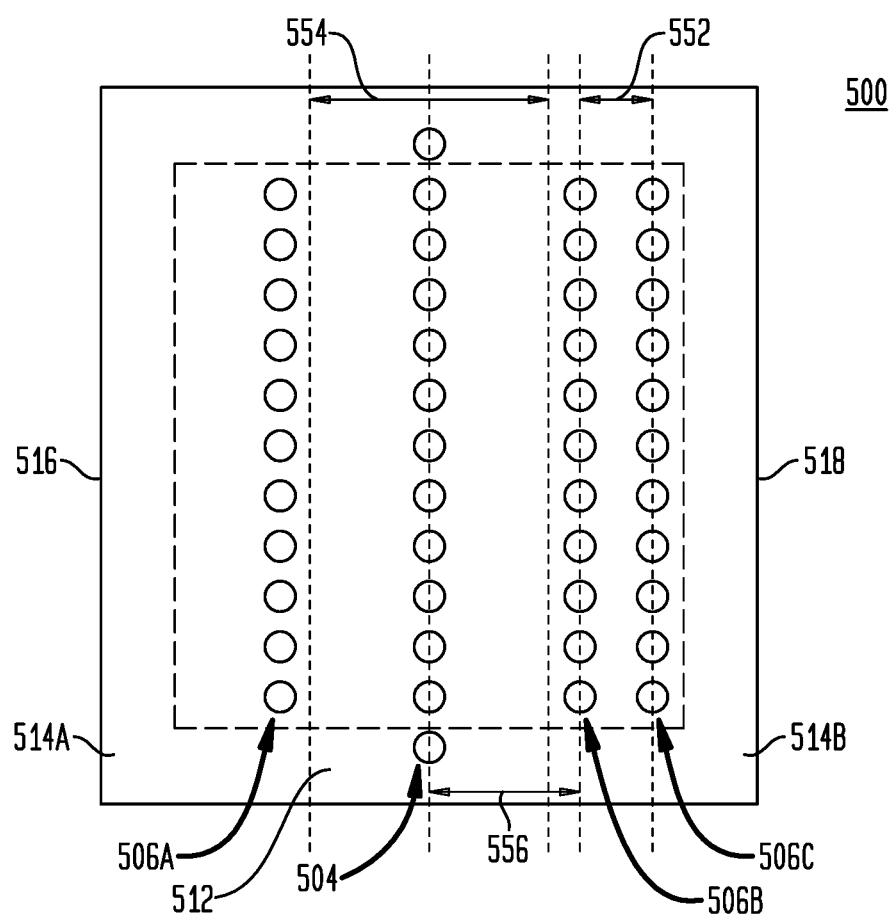
FIG. 9A is a plan view illustrating an alternative arrangement of terminals on a microelectronic package according to another variation of the embodiment shown in FIGS. 5 and 6A.
Figure 9B:
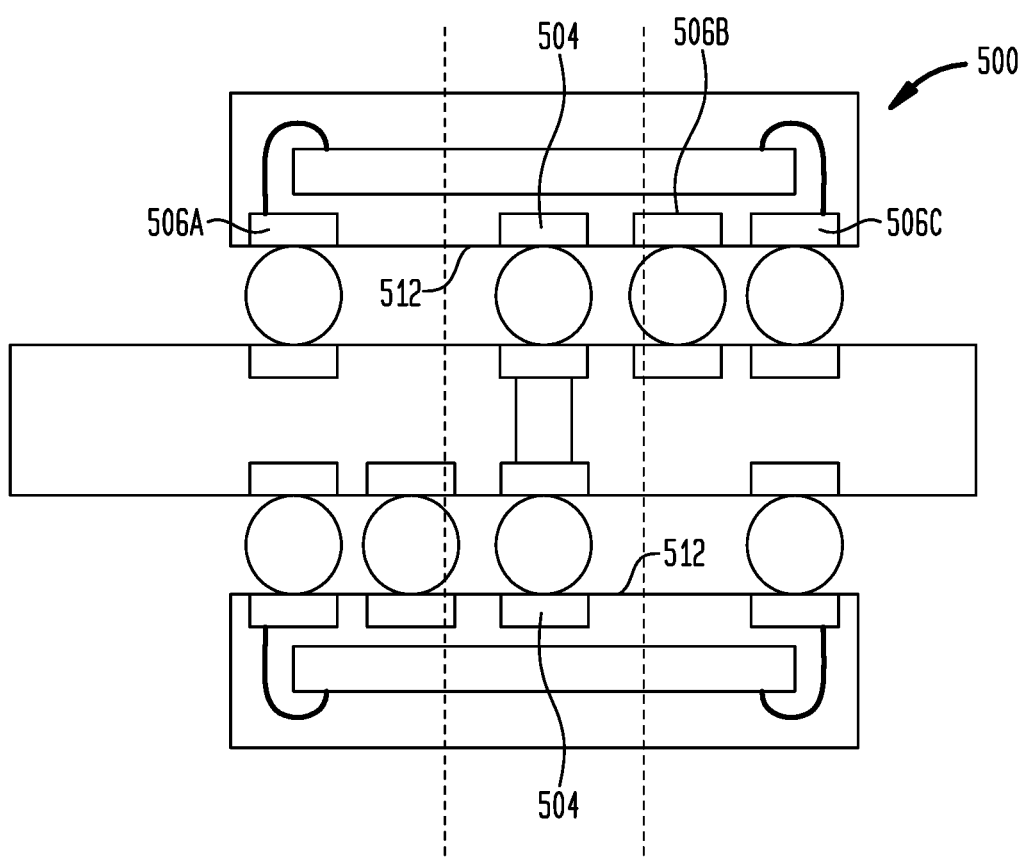
FIG. 9B is a sectional view illustrating a microelectronic assembly and first and second microelectronic packages as shown in FIG. 9A electrically interconnected therewith in accordance with an embodiment of the invention.

In the microelectronic package 500 illustrated in FIGS. 9A and 9B, the first terminals are arranged at positions within a single column 504 disposed in the central region 512 of the substrate surface, the single column extending in a direction parallel to the edges 516, 518 of the microelectronic package. Hereinafter, unless otherwise noted, for ease and clarity of description, the second terminals may be omitted from the figures illustrating various aspects of the invention, although the second terminals may nevertheless be present in such embodiments.

In the particular example seen in FIG. 9A, the minimum pitch between any two columns of terminals on the substrate is the pitch 552 between the adjacent columns 506B and 506C of second terminals disposed in peripheral region 514B of the substrate surface. The width 554 of the central region is not greater than three and one-half times the minimum pitch 552 between the columns 506B and 506C of terminals.

Figure 10A:
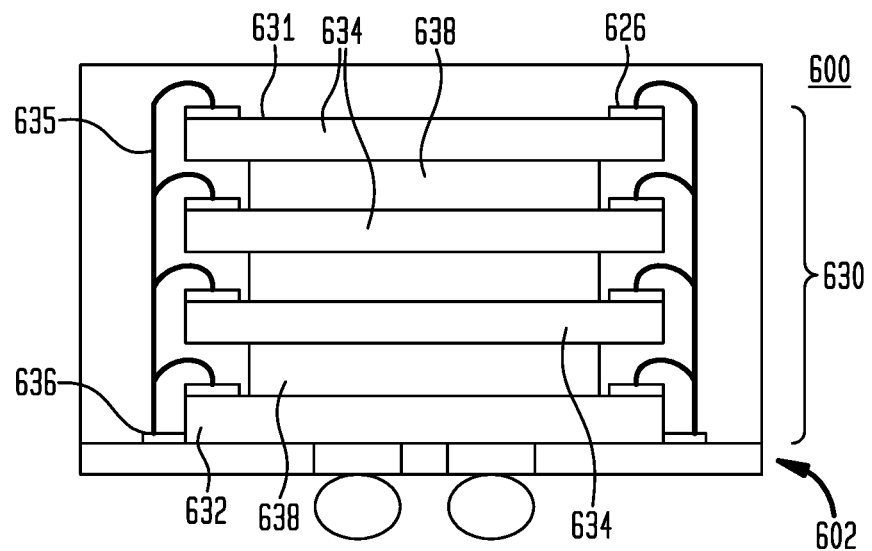
FIG. 10A is a sectional view illustrating a microelectronic package including a stacked electrically connected assembly of semiconductor chips therein in accordance with an embodiment of the invention.

FIG. 10A illustrates a microelectronic package 600 according to a particular example in which the microelectronic element includes a vertical stack 630 of an electrically interconnected first semiconductor chip 632 and a plurality of second semiconductor chips 634, each having a contact-bearing front face 631 that faces away from the substrate 602 and a rear face that faces toward the first surface of the substrate. Wire bonds 635 electrically interconnect the contacts 626 on the semiconductor chips 632, 634 with corresponding contacts 636 on the substrate. Spacers 638 can be disposed between adjacent faces of the semiconductor chips 634, and a spacer 638 can be disposed between the contact-bearing face 631 of the semiconductor chip 632 and a rear face of semiconductor chip 634. In some cases, adhesive layers (not shown) can be provided between each spacer and the faces of the semiconductor chips adjacent to such spacer. As shown in FIG. 10A, the one or more second semiconductor chips 634 are electrically interconnected with the first semiconductor chip 632. For example, as seen in FIG. 10A, there are three vertically stacked second semiconductor chips 634 in which the faces 631 thereof are parallel to one another.

In the microelectronic package 600 seen in FIG. 10A, each of the first and second semiconductor chips 632, 634 can be configured such that each such semiconductor chip has memory storage array function. In one example, each such semiconductor chip can embody a greater number of active devices to provide memory storage array function than any other function. For example, each of the first and second semiconductor chips may include a memory storage array and all circuitry required for inputting data to and outputting data from the memory storage array. For example, when the memory storage array in each semiconductor chip is writeable, each of the semiconductor chips may include circuitry configured to receive external data input from terminals of the package, as well as circuitry configured to transfer data output from such semiconductor chip to terminals of the package. Thus, each first and each second semiconductor chip 632, 634 can be a dynamic random access memory ("DRAM") chip or other memory chip which is capable of inputting and outputting data from the memory storage array within such semiconductor chip and receiving and transmitting such data to a component external to the microelectronic package. Stated another way, in such case, signals to and from the memory storage array within each DRAM chip or other memory chip does not require buffering by an additional semiconductor chip within the microelectronic package.

Alternatively, in another example, the one or more second semiconductor chips 634 may embody a greater number of active devices to provide memory storage array function than any other function, but the first semiconductor chip 632 may be a different type of chip. In this case, the first semiconductor chip 632 can be configured, e.g., designed, constructed, or set up, to buffer signals, i.e., regenerate signals received at the terminals for transfer to the one or more second semiconductor chips 634, or to regenerate signals received from one or more of the second semiconductor chips 634 for transfer to the terminals, or to regenerate signals being transferred in both directions from the terminals to the one or more second semiconductor chips 634; and from the one or more semiconductor chips to the terminals of the microelectronic package. Alternatively or in addition to regenerating signals as described above, in a particular example, the first semiconductor chip can be configured to partially or fully decode at least one of address information or command information received at the terminals, such as at the first terminals. The first chip can then output the result of such partial or full decoding for transfer to the one or more second semiconductor chips 634.

In a particular example, the first semiconductor chip can be configured to buffer the command signals, address signals and clock signals which are transferred to the one or more second semiconductor chips. For example, the first semiconductor chip 632 can be a buffer chip which embodies a greater number of active devices to provide a buffering function in transferring signals to other devices, e.g., to the one or more second semiconductor chips 634, than for any other function. Then, the one or more second semiconductor chips may be reduced function chips which have memory storage arrays but which can omit circuitry common to DRAM chips, such as buffer circuitry, decoders or predecoders or wordline drivers, among others. In that case, the first chip 632 may function as a "master" chip in the stack and to control operations in each of the second semiconductor chips 634.

In a particular example, the second semiconductor chips may be configured such that they are not capable of performing the buffering function, and so the stacked arrangement of the first and second semiconductor chips is configured such that the buffering function required in the microelectronic package can be performed by the first semiconductor chip, and cannot be performed by any of the second semiconductor chips in the stacked arrangement.

In any of the embodiments described herein, the one or more second semiconductor chips can be implemented in one or more of the following technologies: DRAM, NAND flash memory, RRAM ("resistive RAM" or "resistive random access memory"), phase-change memory ("PCM"), magnetoresistive random access memory, e.g. such as may embodiment tunnel junction devices, static random access memory ("SRAM"), spin-torque RAM, or content-addressable memory, among others.

Figure 10B:
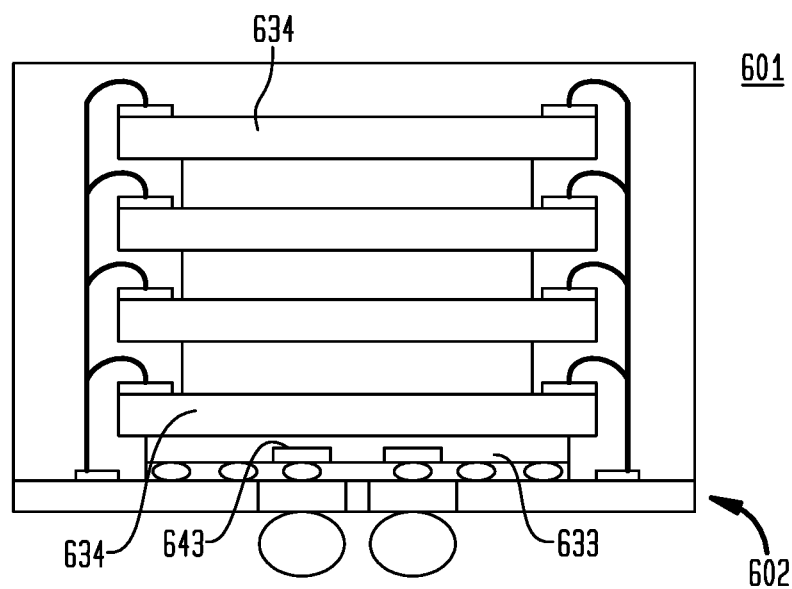
FIG. 10B is a sectional view illustrating a microelectronic package according to a variation of the embodiment shown in FIG. 10A.

FIG. 10B illustrates a variation of the above-described embodiment in which the first semiconductor chip 633 within microelectronic package 601 is configured to buffer at least some signals received at terminals of the package, e.g., the first terminals, for transmission to other semiconductor chips 634 within the package. In this variation, the first semiconductor chip 633 can be mounted to the substrate 602 in flip-chip orientation, i.e., having contacts 643 on a face thereof facing corresponding contacts on the substrate 602 and being joined thereto such as by solder, other bond metal or other conductive material.

Figure 11A:
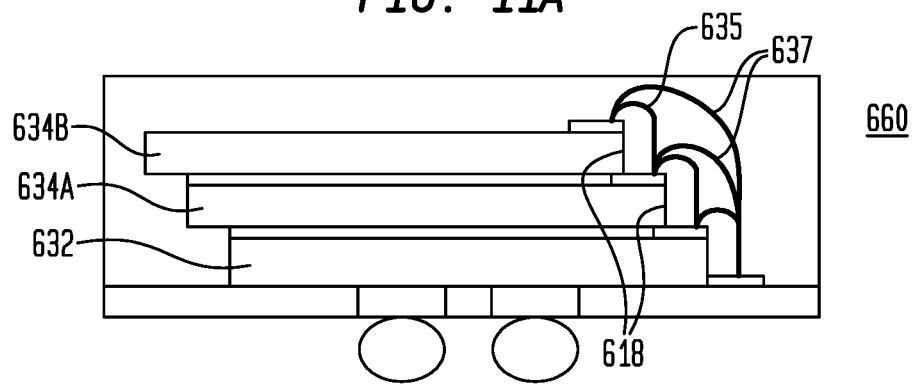
FIGS. 11A and 11B are a sectional view and a corresponding top view illustrating a microelectronic package including a stacked electrically connected assembly of semiconductor chips therein in accordance with an embodiment of the invention.
Figure 11B:
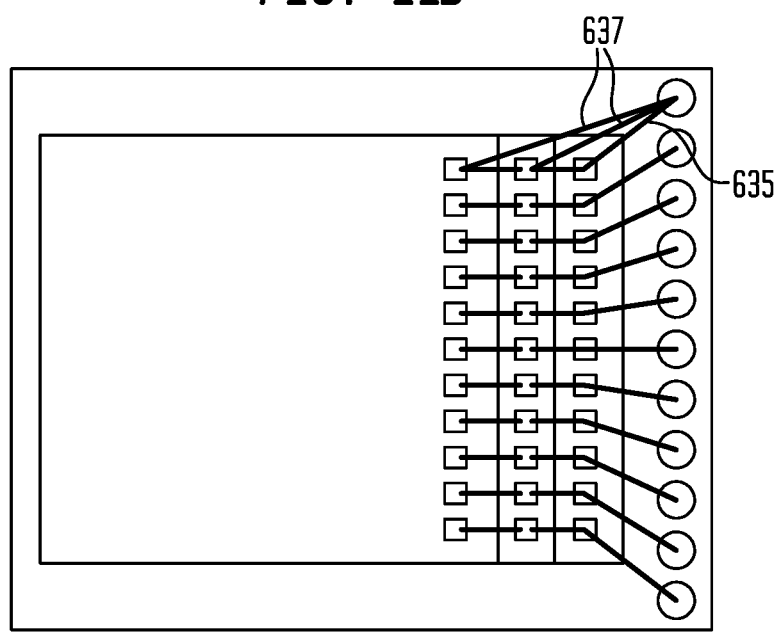

FIG. 11A is a sectional view and FIG. 11B is a corresponding plan view illustrating a microelectronic package 660 according to a further variation in which the second semiconductor chips 634 are mounted in stair-step manner relative to one another such that the contacts of the first semiconductor chip 632 are exposed beyond an edge 618 of the second semiconductor chip 634A immediately above the first semiconductor chip 632, and the contacts of that semiconductor chip 634A are exposed beyond an edge 618 of the second semiconductor chip 634B immediately above that second semiconductor chip. Electrical connections between the first and second chips and the substrate and among the chips can be provided by wire bonds 635 which electrically connect adjacent chips within the stack of semiconductor chips, or wire bonds 637 which electrically connect the chips directly to the package substrate 662.

Figure 12:
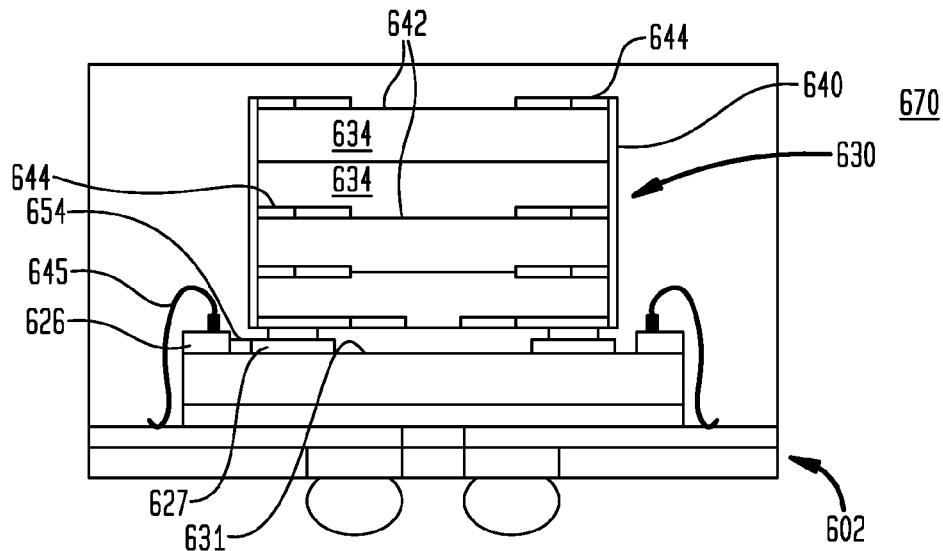
FIG. 12 is a sectional view illustrating a microelectronic package including a stacked electrically connected assembly of semiconductor chips therein in accordance with an embodiment of the invention.

FIG. 12 illustrates a microelectronic package 670 according to a further variation of the embodiment described above relative to FIG. 10A, in which connections between contacts of the one or more second semiconductor chips 634 can include traces or leads 640 which extend along one or more edges of a unit of stacked semiconductor chips 630, i.e., along edges of the semiconductor chips 634 within such unit 630. Unit 630 is mounted and electrically interconnected with contacts 627 of the first semiconductor chip 632, such as with a bond metal, e.g., solder, tin, gold, indium, a eutectic, or electrically conductive bumps, or both, which may in some cases include conductive posts, e.g., micropillars. Traces 654 may extend along a face 631 of the first semiconductor chip from the contacts 627 to second contacts 626, which in turn can be electrically connected with the substrate, such as through wire bonds 645.

The electrical connections between the second semiconductor chips 634 may further include traces 644 which extend along front faces of the second semiconductor chips 634. As further shown in FIG. 12, the front faces 642 of the second semiconductor chips may face upwardly away from the substrate 602 or downwardly towards the substrate 602.

Figure 13A:
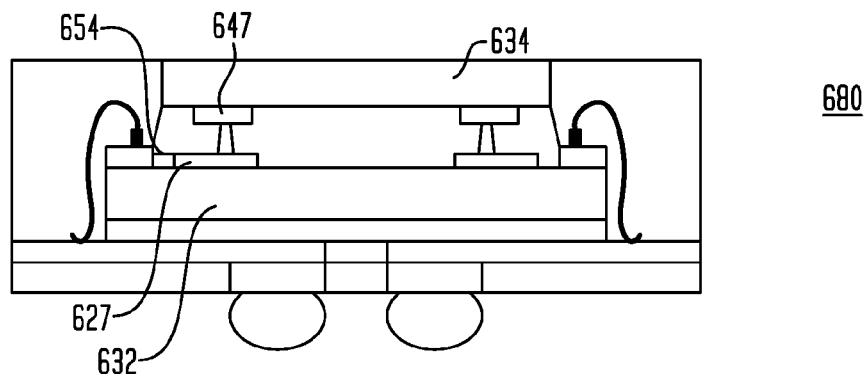
FIG. 13A is a sectional view illustrating a microelectronic package according to a variation of the embodiment shown in FIG. 12.

FIG. 13A further illustrates a microelectronic package 680 in which a second semiconductor chip 634 has contacts 647 facing contacts 627 of the first chip and joined thereto in flip-chip manner, such as through a bond metal, e.g., solder, tin, gold, indium, a eutectic, or electrically conductive bumps, or both. Traces 654 may electrically connect the contacts 627 with other contacts 626 on the first chip that are electrically connected to the substrate, such as through wire bonds.

Figure 13B:
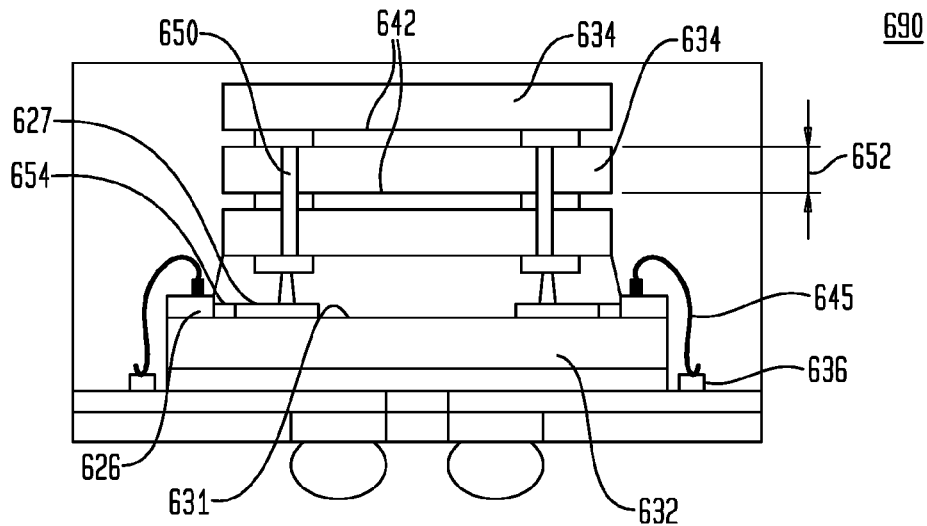
FIG. 13B is a sectional view illustrating a microelectronic package according to another variation of the embodiment shown in FIG. 12.

FIG. 13B further illustrates a microelectronic package 690 according to a particular example in which the one or more second semiconductor chips 634 are electrically connected with one another by through-silicon vias ("TSVs") 650 that extend in a direction of the thicknesses 652 of at least some of the second semiconductor chips 634, i.e., in a direction normal to the faces 642 of the chips 634. As seen in FIG. 13B, in one example, the TSVs 650 can be electrically connected with contacts 627 of the first semiconductor chip 632, such as through a bond metal, e.g., solder, tin, gold, indium, a eutectic, or electrically conductive bumps, or both, which may in some cases include conductive posts, e.g., micropillars. Traces 654 may extend along a face 631 of the first semiconductor chip from the contacts 627 to second contacts 626, which in turn can be wire-bonded to the substrate.

In one example, information or signals received at terminals of the package 690, such as at the first terminals, the second terminals, or both, can be received by the first semiconductor chip 632 through wire bonds 645 that are joined to substrate contacts 636, which in turn are joined to such terminals of the microelectronic package. The first semiconductor chip 632, operating as a buffer element, can then regenerate the received information or signals and then transfer the regenerated information or signals to the one or more second semiconductor chips, e.g., through the connections between the first and second chips 632, 634 and through the TSVs 650 within the stack of second chips 634.

Figure 13C:
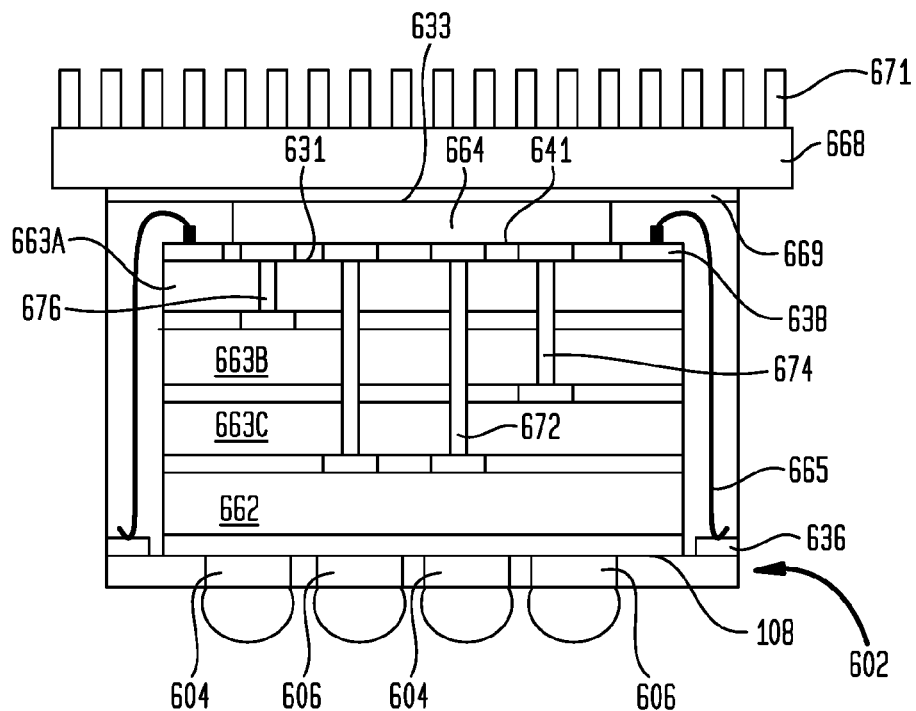
FIG. 13C is a sectional view illustrating a microelectronic package according to a variation of the embodiment shown in FIG. 13B.

FIG. 13C illustrates a variation of the microelectronic package shown in FIG. 13B. Unlike the package shown in FIG. 13B, semiconductor chip 664, which is configured to regenerate or at least partially decode address information or other information, e.g., regenerate signals for transfer to other semiconductor chips in the package, is not located adjacent to the first surface 108 of the substrate 602. Rather, in this case, the semiconductor chip 664 can be disposed at a position within the package that overlies one or more other semiconductor chips. For example, as shown in FIG. 13C, the chip 664 at least partially overlies the semiconductor chip 662 that is disposed adjacent to the first surface 108 of the substrate 602 and at least partially overlies semiconductor chips 663A, 663B and 663C which are disposed atop semiconductor chip 662.

In one example, the semiconductor chips 662 and 663A, 663B and 663C may include memory storage arrays. As in the examples described above, such chips 662, and 663A, 663B and 663C may each incorporate circuits configured to buffer, e.g., temporarily store, data that is to be written to such chip, or data that is being read from such chip, or both. Alternatively, the chips 662, and 663A, 663B and 663C may be more limited in function and may need to be used together with at least one other chip that is configured to temporarily store data that is to be written to such chip or data that is being read from such chip, or both.

The semiconductor chip 664 can be electrically connected to terminals of the microelectronic package, e.g., to grids in which the first terminals 604 and the second terminals 606 are disposed, through electrically conductive structure, e.g., wire bonds 665, that partially overlies a front face 631 of the semiconductor chip 663A and that connects to contacts 636 exposed at the first surface 108 of the substrate 602. The electrically conductive structure, e.g., the wire bonds 665, can electrically connect to the semiconductor chip 664 through contacts 638 on a chip 663A and through conductors (not shown) that extend along the face 631 of the chip 663A, or along a confronting face 641 of the chip 664, or along the faces 631, 641 of both of the chips 663A, 664. As indicated above, the semiconductor chip 664 may be configured to regenerate or at least partially decode signals or information that it receives through the conductive structure, e.g., the wire bonds 665, and it may be configured to transfer the regenerated or at least partially decoded signals or information to other chips within the package such as to the chips 662, and 663A, 663B and 663C.

As further seen in FIG. 13C, the semiconductor chips 662, 663A, 663B and 663C can be electrically connected to the semiconductor chip 664 and to one another by a plurality of through-silicon vias ("TSVs") 672, 674, and 676 that can extend through one, two, or three or more of such chips. Each such TSV may electrically connect with wiring within the package, e.g., conductive pads or traces of two or more of the semiconductor chips 662, 663A, 663B and 663C and 664. In a particular example (not shown), through silicon vias may extend through the thicknesses of all semiconductor chips 662, 663A, 663B and 663C, even though each through silicon via may not electrically connect with each such semiconductor chip through which it extends.

As further seen in FIG. 13C, a heat sink or heat spreader 668, which may include a plurality of fins 671, can be thermally coupled to a face of the semiconductor chip 664, e.g., a rear face 633 thereof, such as through a thermally conductive material such as thermal adhesive, thermally conductive grease, or solder, among others.

The microelectronic assembly 695 shown in FIG. 13C may be configured to operate as a memory module capable of transferring a designated number of data bits per cycle onto or off of the microelectronic package through the first and second terminals provided therefor on the substrate. For example, the microelectronic assembly may be configured to transfer a number of data bits such as thirty-two data bits, sixty-four data bits, or ninety-six data bits, among other possible configurations, to or from an external component such as a circuit panel that can be electrically connected with the terminals 604, 606. In another example, when the bits transferred to and from the package include error correction code bits, the number of bits transferred per cycle to or from the package may be thirty-six bits, seventy-two bits, or one-hundred-eight bits. Other data widths are possible other than those that are specifically described here.

Figure 14A:
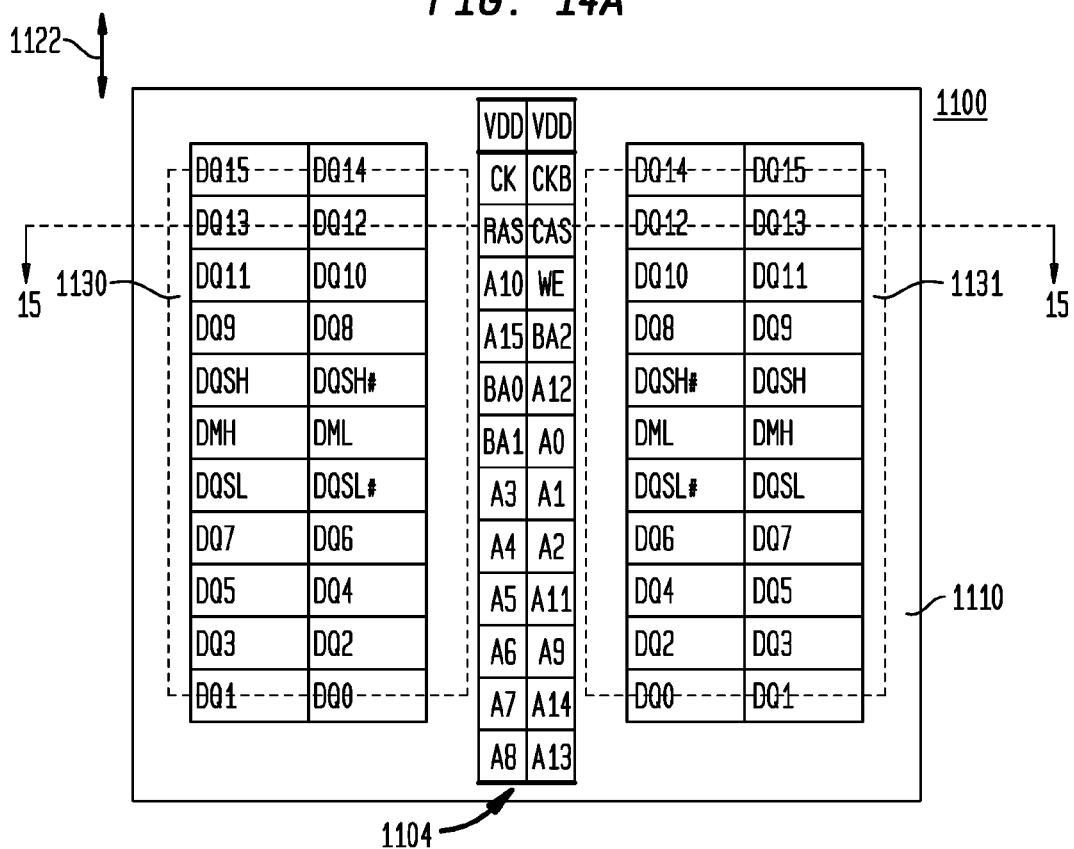
FIG. 14A is a diagrammatic plan view illustrating an arrangement and signal assignment of terminals in a microelectronic package according to another embodiment of the invention.
Figure 15:
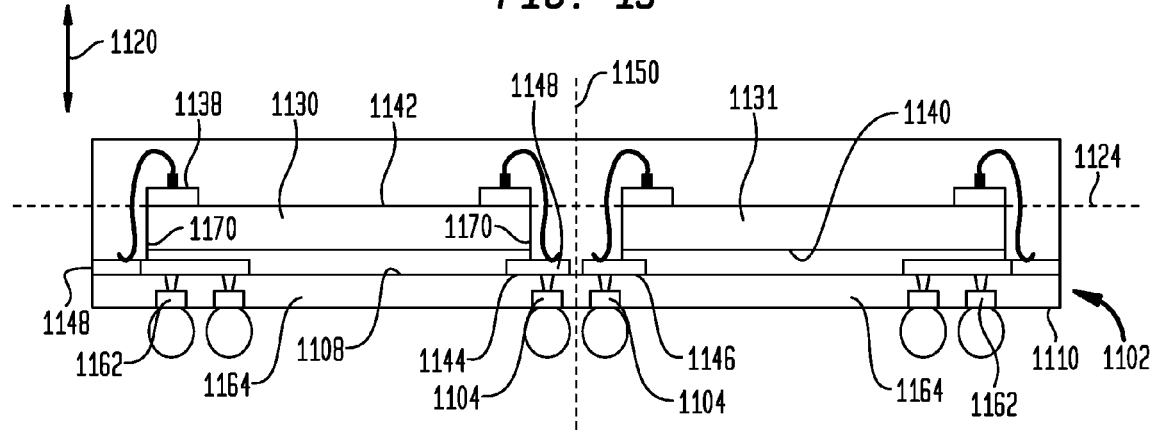
FIG. 15 is a sectional view through line 15-15 of FIG. 14A further illustrating the microelectronic package shown in FIG. 14A.

FIGS. 14A, 14B, and 15 illustrate a microelectronic package 1100 according to a further variation of one or more of the above-described embodiments. As seen in FIGS. 14A, 14B, and 15, the package 1100 includes first and second microelectronic elements 1130, 1131 that are spaced apart from one another on a first surface 1108 of the substrate 1102. Each microelectronic element 1130, 1131 has first parallel edges 1170 extending away from a face 1142 of the respective microelectronic element which faces away from the substrate 1102, and second parallel edges 1172 that extend in a direction transverse or orthogonal to a direction in which the first edges extend.

The contacts 1138 of the microelectronic elements are electrically connected with corresponding substrate contacts 1148 on the first surface 1108 of the substrate 1102. In turn, some of the substrate contacts 1148 are electrically connected with first terminals 1104 disposed in a central region 1112 on the second surface 1110, such as through electrically conductive traces 1144, or through electrically conductive vias 1146, or through both traces and vias. In some embodiments, some of the substrate contacts 1148 may instead be electrically connected with second terminals 1162 in one or more peripheral regions 1164 of the second surface. FIG. 14A illustrates possible signal assignments of the terminals 1104, 1162 on the package.

As in the above-described embodiments, the central region 1112 of the substrate surface 1110 has a width 1154 that is not greater than three and one-half times a minimum pitch 1152 between any two adjacent columns of terminals on the package, where each of the two adjacent columns has a plurality of terminals therein. An axial plane 1150 normal to the surface 1110 of the substrate 1102 intersects the surface 1110 along a line which is parallel to and centered among the first edges 1170 of the first and second microelectronic elements 1130, 1131. In one example, an axis 1151 along which a column of first terminals 1104 extends can be disposed between adjacent edges 1134, 1135 of the first and second microelectronic elements as shown therein. This can be true for the axes of more than one columns of the terminals.

Alternatively, although not shown in FIGS. 14A-B and 15, the axis along which a column of the first terminals 1104 extends can overlie one or more of the faces 1140 of the first and second microelectronic elements 1130, 1131, and this may be true for the axes of more than one column. There may be four columns of terminals or fewer in the central region 1112 of the surface 1110. As in the above-described embodiments, there need not be more than a single column of first terminals 1104 in the central region. As further shown in FIG. 15, the faces 1142 of the first and second microelectronic elements can extend within a single plane 1124 parallel to the first surface 1108 of the substrate 1102.

Figure 16A:
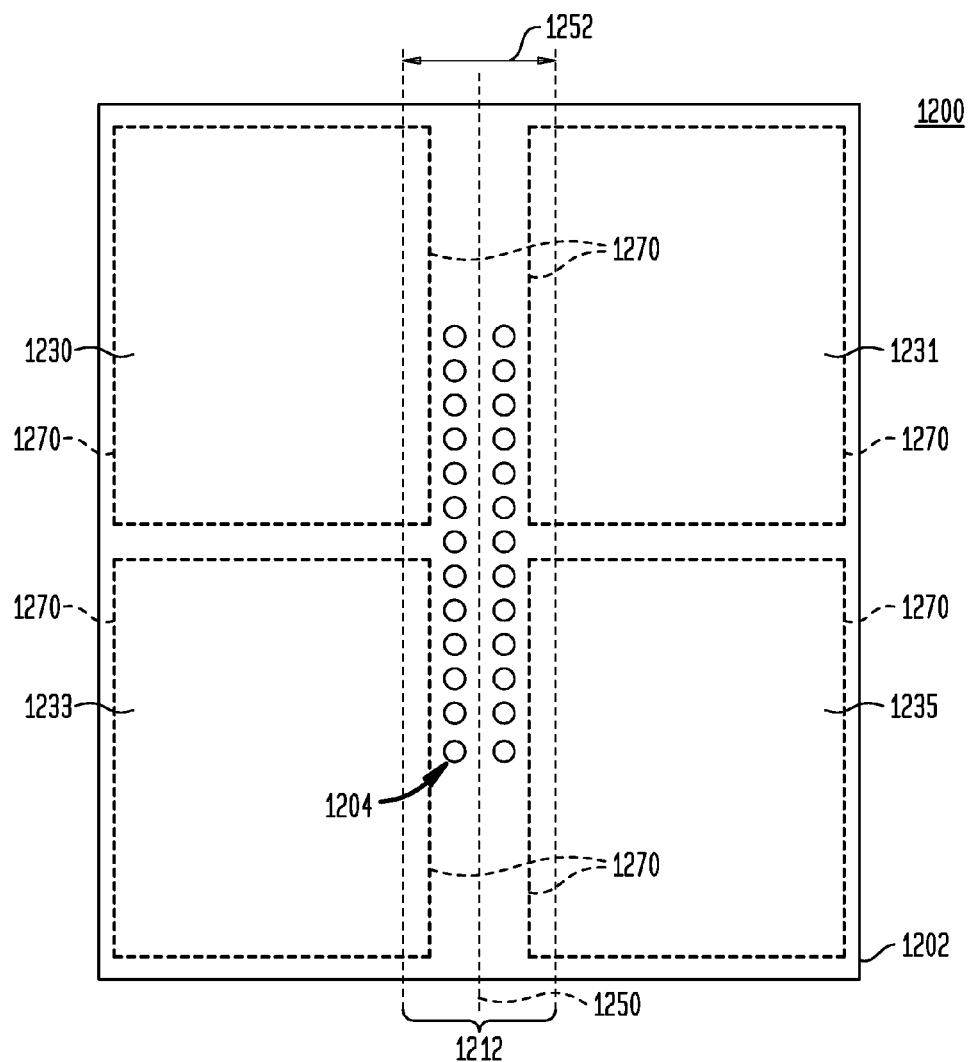
FIG. 16A is a diagrammatic plan view illustrating an arrangement of terminals in a microelectronic package according to yet another embodiment of the invention.
Figure 16B:
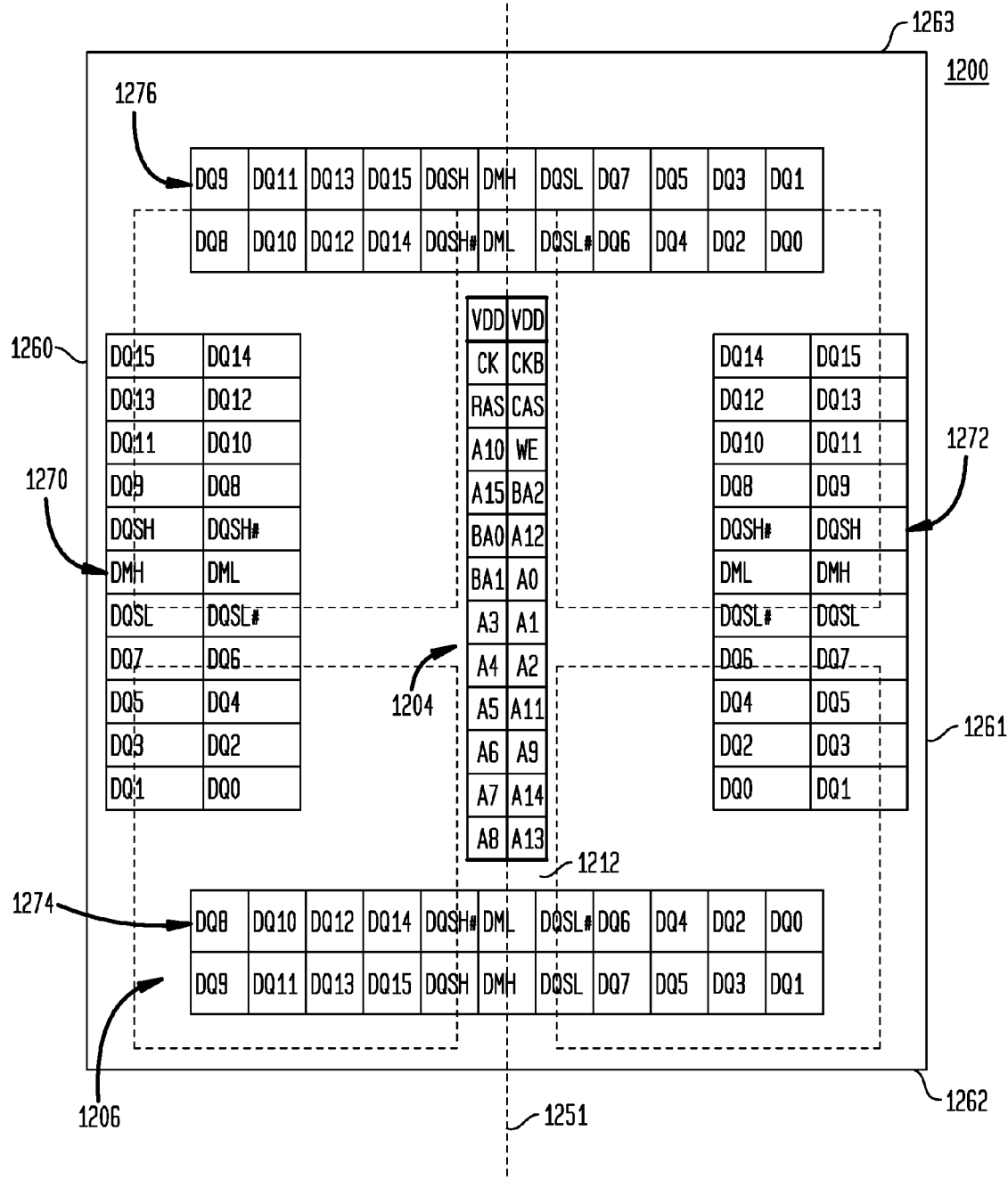
FIG. 16B is a plan view further illustrating an arrangement and signal assignment of terminals in accordance with the embodiment shown in FIG. 16A.

FIGS. 16A-16B illustrate a microelectronic package 1200 according to a variation of the embodiment seen in FIGS. 14A-B and 15 which, in addition to first and second microelectronic elements 1230, 1231 having the same arrangement and electrical interconnections within the package 1200 as discussed above regarding microelectronic package 1100 (FIGS. 14A-B, 15), further includes third and fourth microelectronic elements 1233 and 1235. Like the first and second microelectronic elements, each of the third and fourth microelectronic elements may embody a greater number of active devices to provide memory storage array function than any other function. Like the first and second microelectronic elements, the third and fourth microelectronic elements 1233 and 1235 are mounted face-up on the substrate 1202 and are electrically interconnected with the first terminals 1204 of the package, such as through electrical connections extending above the respective contact-bearing faces (not shown) of the microelectronic elements. The electrical connections can be wire bonds, as discussed above.

The terminals 1204 of the microelectronic package can be arranged within a central region 1212 having width 1252 no greater than three and one-half times the minimum pitch between columns of terminals, as described above. As further shown in FIG. 16A, the intersection of the axial plane 1250 with the substrate 1202 can be centered among all of the first parallel edges 1270 of the first, second, third and fourth microelectronic elements within the package 1200.

In like manner to that described above relative to FIGS. 14A-B and 15, the contact-bearing faces (not shown) of the microelectronic elements 1230, 1231, 1233 and 1235 can be arranged within the package 1200 such that all of such faces are co-planar, i.e., extend within a single plane, i.e., such as a single plane 1124 as illustrated in FIG. 15.

FIG. 16B illustrates a possible signal assignment of terminals on the package 1200 in which first terminals 1204 are arranged in one or more columns in the central region and second terminals 1206 are arranged in multiple areas near peripheral edges 1260, 1261, 1262 and 1263 of the package. In this case, some of the second terminals 1206 can be disposed at positions within a grid such as grid 1270, and some second terminals can be disposed at positions within a grid such as grid 1272. In addition, some second terminals can be disposed at positions within a grid such as grid 1274, and some second terminals can be disposed at positions within a grid 1276.

As shown in FIG. 16B, the signal class assignments of the second terminals 1206 in the grid 1276 can be symmetric about a vertical axis 1251 that can extend within the axial plane 1250, and the signal class assignments of the second terminals in the grid 1274 can be symmetric about the vertical axis 1251. As used herein, two signal class assignments can be symmetric with respect to one another if the signal assignments are in the same class of assignments, even if the numerical index within the class differs. Exemplary signal class assignments can include data signals, data strobe signals, data strobe complement signals, and data mask signals. In a particular example, in the grid 1276, the second terminals 1206 having signal assignments DQSH# and DQSL# are symmetric about the vertical axis 1251 with respect to their signal class assignment, which is data strobe complement, even though those second terminals have different signal assignments.

As further shown in FIG. 16B, the assignments of the data signals to the spatial positions of the second terminals on the microelectronic package, such as for data signals DQ0, DQ1, . . . , for example, can have modulo-X symmetry about the vertical axis 1251. The modulo-X symmetry can help preserve signal integrity in an assembly 300 such as seen in FIG. 7B, in which one or more pairs of first and second packages are mounted opposite one another to a circuit panel, and the circuit panel electrically connects corresponding pairs of second terminals of those first and second packages in each oppositely-mounted package pair. As used herein, when the signal assignments of terminals have "modulo-X symmetry" about an axis, terminals that carry signals that have the same number "modulo-X" are disposed at positions that are symmetric about the axis. Thus, in such assembly 300 such as in FIG. 7B, modulo-X symmetry can permit electrical connections to be made through the circuit panel so that a terminal DQ0 of a first package can be electrically connected through the circuit panel to a terminal DQ8 of the second package that has the same index number modulo X (X being 8 in this case), so that the connection can be made in a direction essentially straight through, i.e., normal to, the thickness of the circuit panel.

In one example, "X" can be a number $2^n$ (2 to the power of n), wherein n is greater than or equal to 2, or X can be 8×N, N being two or more. Thus, in one example, X may be equal to the number of bits in a half-byte (4 bits), byte (8 bits), multiple bytes (8×N, N being two or more), a word (32 bits) or multiple words. In such way, in one example, when there is modulo-8 symmetry as shown in FIG. 16B, the signal assignment of a package terminal DQ0 in grid 1274 configured to carry data signal DQ0 is symmetric about the vertical axis 1251 with the signal assignment of another package terminal configured to carry data signal DQ8. Moreover, the same is true for the signal assignments of package terminals DQ0 and DQ8 in grid 1276. As further seen in FIG. 16B, the signal assignments of package terminals DQ2 and DQ10 in grid 1274 have modulo-8 symmetry about the vertical axis, and the same is also true for grid 1276. Modulo-8 symmetry such as described herein can be seen in grids 1274, 1276 with respect to each of the signal assignments of package terminals DQ0 through DQ15.

It is important to note that, although not shown, the modulo number "X" can be a number other than $2^n$ (2 to the power of n) and can be any number greater than two. Thus, the modulo number X upon which the symmetry is based can depend upon how many bits are present in a data size for which the package is constructed or configured. For example, when the data size is 10 bits instead of 8, then the signal assignments may have modulo-10 symmetry. It may even be the case that when the data size has an odd number of bits, the modulo number X can have such number.

Figure 17A:
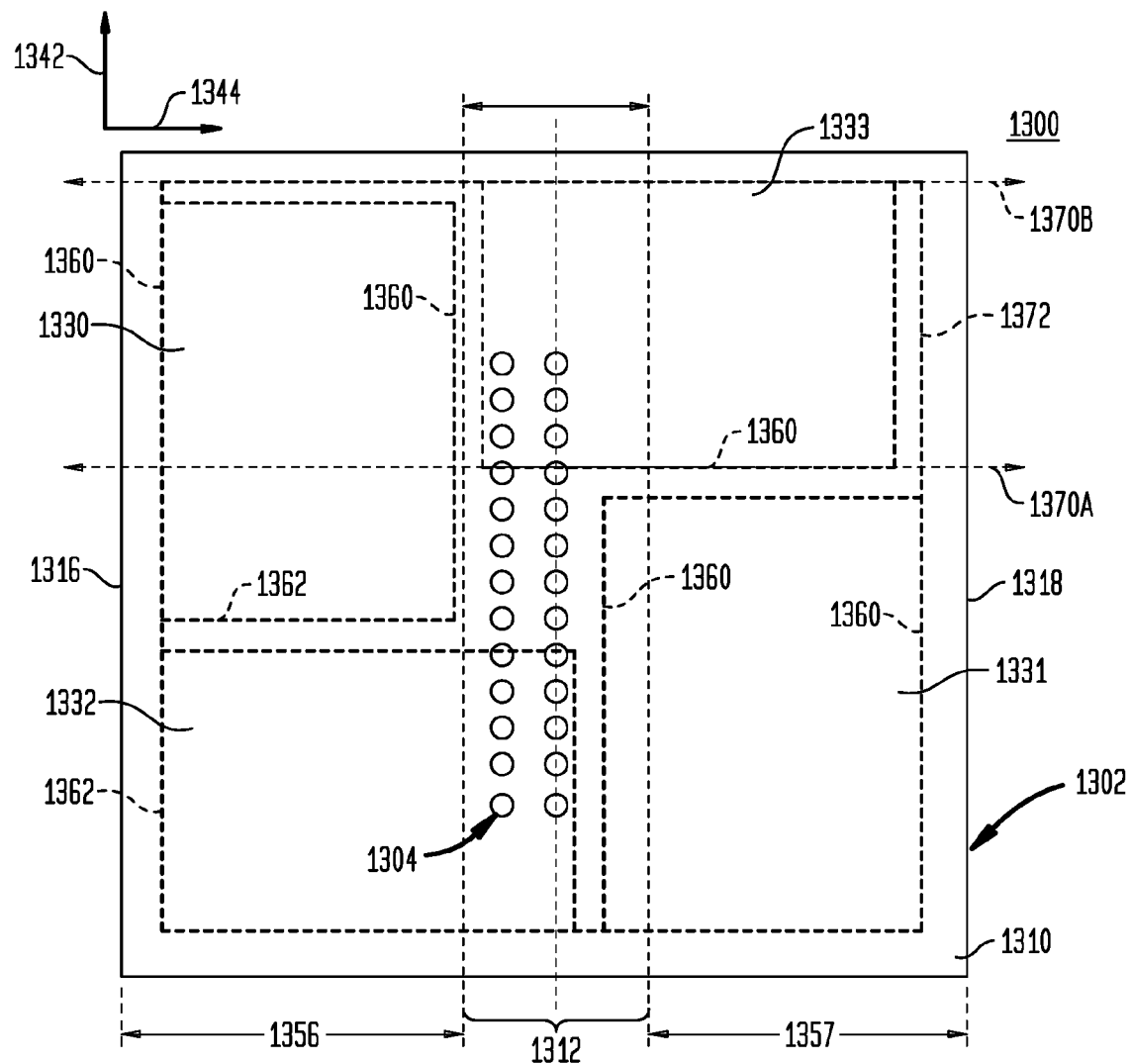
FIG. 17A is a diagrammatic plan view illustrating an arrangement of terminals in a microelectronic package according to a variation of the embodiment shown in FIGS. 16A and 16B.
Figure 17B:
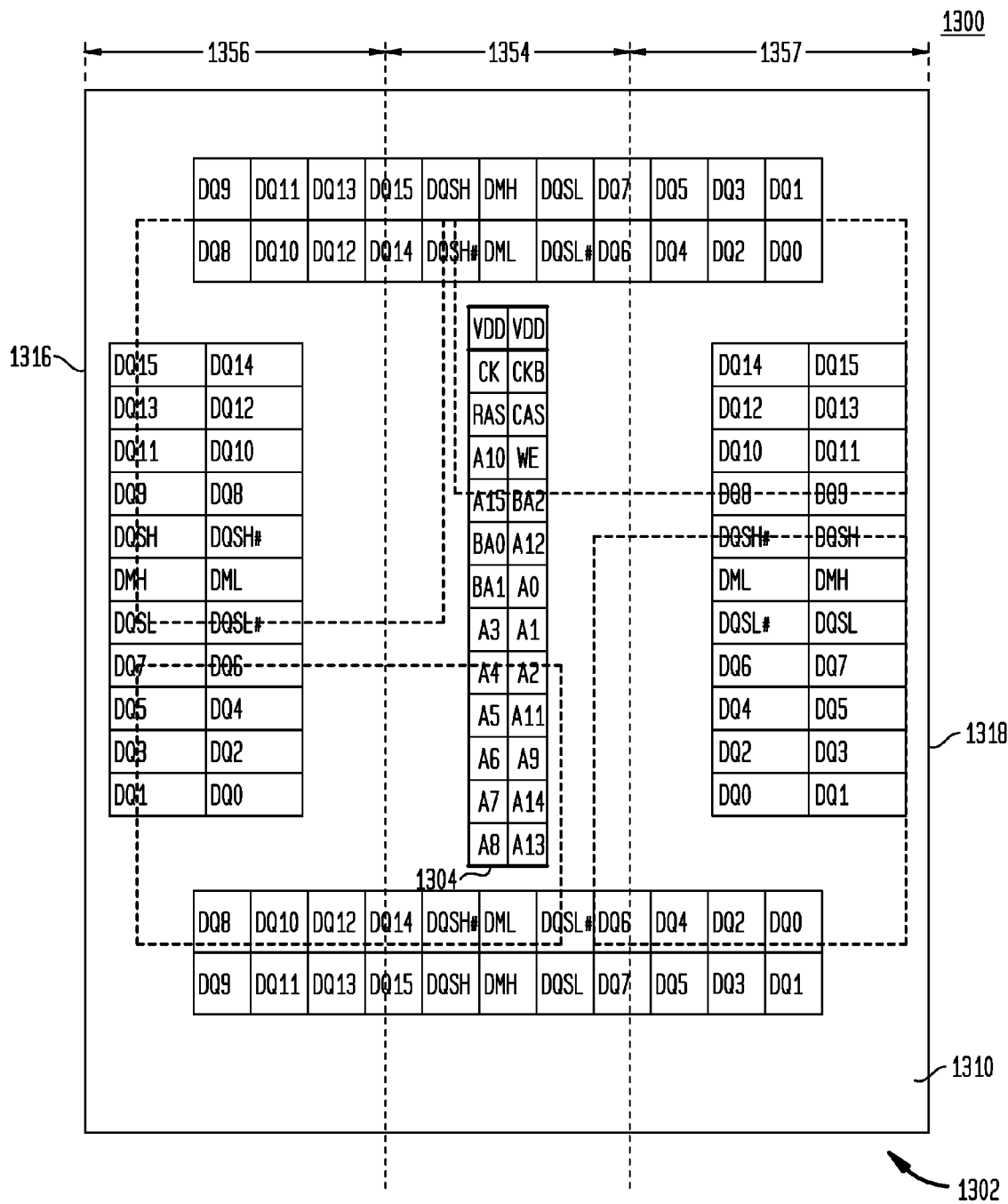
FIG. 17B is a plan view further illustrating an arrangement and signal assignment of terminals in accordance with the embodiment shown in FIG. 17A.

FIGS. 17A and 17B illustrate a microelectronic package 1300 according to a variation of the embodiment 1200 described above relative to FIGS. 16A and 16B, the package 1300 having a substrate surface 1310 having a central region 1312 in which first terminals 1304 are disposed. As seen therein, microelectronic elements 1330, 1331 are arranged on substrate 1302 in a manner similar to the arrangement of microelectronic elements 1130, 1131 of microelectronic package 1100 (FIGS. 14A-B, 15), in that edges 1360 of adjacent microelectronic elements 1130, 1131 are parallel to each other and extend in the same first direction 1342. Edges 1362 of microelectronic elements extend in a direction 1344 transverse to, and typically orthogonal to the direction 1342.

In some cases, the first edges 1360 of a respective microelectronic element can have greater length than the second edges 1362 of such microelectronic element. However, in other cases, the second edges 1362 can have greater length than the first edges 1360. In the particular package seen in FIG. 17A, a plane 1370 that contains either first edge 1360 of any of the microelectronic elements 1330, 1331, 1332, or 1333 and which is normal to the face of such microelectronic element intersects the edge 1360 of another microelectronic element within the package 1300. For example, as shown in FIG. 17A, the plane 1370 that contains the edge 1360 of microelectronic element 1333 extends in direction 1344 and intersects the edge 1360 of microelectronic element 1330 within the package. In a particular embodiment, planes 1370A and 1370B that contain the first edges of microelectronic element 1333 intersect the first edge of no more than one other microelectronic element within the package. Thus, plane 1370A intersects edges 1360 of only microelectronic element 1330.

In addition, as further seen in FIG. 17A, the central region 1312 can be further limited. Specifically, FIG. 17A shows that there is a rectangular subsection area 1372 on the surface 1302 of the substrate 1302, beyond which none of the faces of the first, second, third and fourth microelectronic elements 1330, 1331, 1332 and 1333 extend. In the microelectronic package 1300 depicted in FIGS. 17A-17B, the central region 1312 does not extend beyond the boundaries of such rectangular subsection area 1372.

FIG. 17B further illustrates a possible arrangement of terminals within microelectronic package 1300 in which first terminals 1304 are disposed within the central region 1312 which spans a width 1354 in a direction orthogonal to opposed edges 1316, 1318 of the package that is no greater than three and one-half times the minimum pitch between the closest two adjacent columns of terminals on the package. Peripheral regions take up the remaining area of the surface 1310 of the substrate 1302, spanning widths 1356, 1357 between edges of the central region and the opposed edges 1316, 1318 of the package, respectively.

Figure 18:
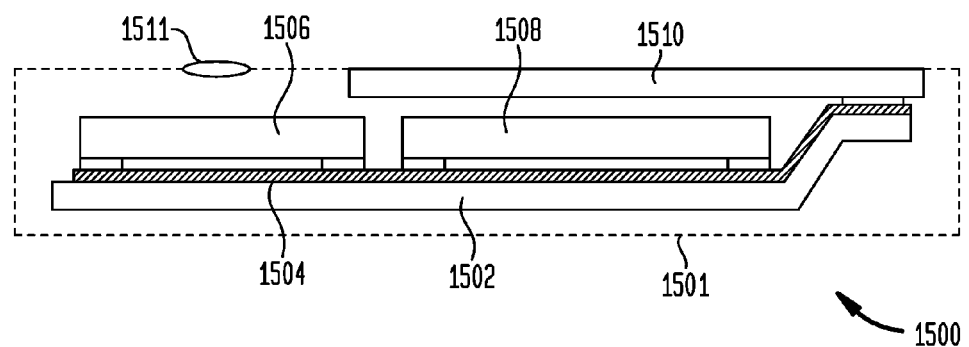
FIG. 18 is a schematic sectional view illustrating a system according to an embodiment of the invention.

The microelectronic packages and microelectronic assemblies described above with reference to FIGS. 5 through 17B can be utilized in construction of diverse electronic systems, such as the system 1500 shown in FIG. 18. For example, the system 1500 in accordance with a further embodiment of the invention includes a plurality of modules or components 1506 such as the microelectronic packages and/or microelectronic assemblies as described above in conjunction with other electronic components 1508 and 1510.

In the exemplary system 1500 shown, the system can include a circuit panel, motherboard, or riser panel 1502 such as a flexible printed circuit board, and the circuit panel can include numerous conductors 1504, of which only one is depicted in FIG. 18, interconnecting the modules or components 1506 with one another. Such a circuit panel 1502 can transport signals to and from each of the microelectronic packages and/or microelectronic assemblies included in the system 1500. However, this is merely exemplary; any suitable structure for making electrical connections between the modules or components 1506 can be used.

In a particular embodiment, the system 1500 can also include a processor such as the semiconductor chip 1508, such that each module or component 1506 can be configured to transfer a number N of data bits in parallel in a clock cycle, and the processor can be configured to transfer a number M of data bits in parallel in a clock cycle, M being greater than or equal to N.

In one example, the system 1500 can include a processor chip 1508 that is configured to transfer thirty-two data bits in parallel in a clock cycle, and the system can also include four modules 1506 such as the microelectronic package 100 described with reference to FIG. 5, each module 1506 configured to transfer eight data bits in parallel in a clock cycle (i.e., each module 1506 can include first and second microelectronic elements, each of the two microelectronic elements being configured to transfer four data bits in parallel in a clock cycle).

In another example, the system 1500 can include a processor chip 1508 that is configured to transfer sixty-four data bits in parallel in a clock cycle, and the system can also include four modules 1506 such as the microelectronic package 1200 described with reference to FIGS. 16A-B, each module 1506 configured to transfer sixteen data bits in parallel in a clock cycle (i.e., each module 1506 can include four microelectronic elements, each of the four microelectronic elements being configured to transfer four data bits in parallel in a clock cycle).

In the example depicted in FIG. 18, the component 1508 is a semiconductor chip and component 1510 is a display screen, but any other components can be used in the system 1500. Of course, although only two additional components 1508 and 1510 are depicted in FIG. 18 for clarity of illustration, the system 1500 can include any number of such components.

Modules or components 1506 and components 1508 and 1510 can be mounted in a common housing 1501, schematically depicted in broken lines, and can be electrically interconnected with one another as necessary to form the desired circuit. The housing 1501 is depicted as a portable housing of the type usable, for example, in a cellular telephone or personal digital assistant, and screen 1510 can be exposed at the surface of the housing. In embodiments where a structure 1506 includes a light-sensitive element such as an imaging chip, a lens 1511 or other optical device also can be provided for routing light to the structure. Again, the simplified system shown in FIG. 18 is merely exemplary; other systems, including systems commonly regarded as fixed structures, such as desktop computers, routers and the like can be made using the structures discussed above.

Figure 19:
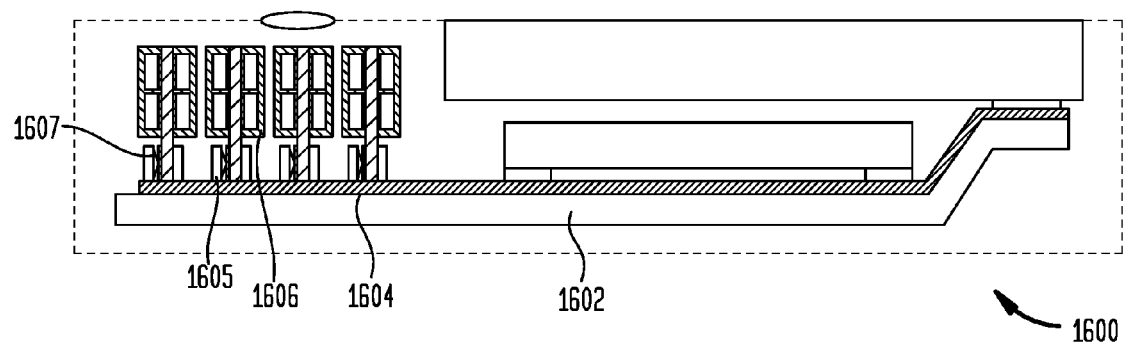
FIG. 19 is a schematic sectional view illustrating a system according to an embodiment of the invention.

The microelectronic packages and microelectronic assemblies described above with reference to FIGS. 5-17B can also be utilized in construction of an electronic system such as the system 1600 shown in FIG. 19. For example, the system 1600 in accordance with a further embodiment of the invention is the same as the system 1500 shown in FIG. 18, except the component 1506 has been replaced by a plurality of components 1606.

Each of the components 1606 can be or can include one or more of the microelectronic packages or microelectronic assemblies described above with reference to FIGS. 5-17B. In a particular example, one or more of the components 1606 can be a variation of the microelectronic assembly 300 shown in FIG. 7B, in which the circuit panel 354 includes exposed edge contacts, and the circuit panel 354 of each microelectronic assembly 300 can be suitable for insertion into a socket 1605.

Each socket 1605 can include a plurality of contacts 1607 at one or both sides of the socket, such that each socket 1605 can be suitable for mating with corresponding exposed edge contacts of a corresponding component 1606 such as the above-described variation of the microelectronic assembly 300. In the exemplary system 1600 shown, the system can include a second circuit panel 1602 or motherboard such as a flexible printed circuit board, and the second circuit panel can include numerous conductors 1604, of which only one is depicted in FIG. 19, interconnecting the components 1606 with one another.

In a particular example, a module such as the system 1600 can include a plurality of components 1606, each component 1606 being the above-described variation of the microelectronic assembly 300. Each component 1606 can be mounted to, and electrically connected with the second circuit panel 1602 for transport of signals to and from each component 1606. The specific example of the system 1600 is merely exemplary; any suitable structure for making electrical connections between the components 1606 can be used.

Various features of the above-described embodiments of the invention can be combined in ways other than as specifically described above without departing from the scope or spirit of the invention. It is intended for the present disclosure to cover all such combinations and variations of embodiments of the invention described above.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic package configured to be joined with contacts of a single component external to the microelectronic package, comprising:
a substrate having first and second opposed surfaces and substrate contacts exposed at the first surface, the substrate defining first, second, third, and fourth peripheral edges;
at least two stacks of semiconductor chips joined with the substrate in an area bounded by the first, second, third and fourth peripheral edges, each stack of semiconductor chips including an upper semiconductor chip and a lower semiconductor chip, the stacks of semiconductor chips being spaced apart from one another in a horizontal direction parallel to the first surface of the substrate, each semiconductor chip having a front face facing away from the first surface, a rear face opposite the front face, and contacts at the front face, the front face of each of the lower semiconductor chips being arranged parallel to the first surface, the rear face of each of the upper semiconductor chips at least partially overlying the front face of the lower semiconductor chip in its stack, and the semiconductor chips together configured to predominantly provide memory storage array function;
conductive structure extending above the front faces electrically connecting element contacts of each of the semiconductor chips of the at least two stacks of semiconductor chips with the substrate contacts; and
a plurality of terminals exposed at the second surface and electrically connected with the substrate contacts, the terminals including first and second groups of data terminals, each of the first and second groups having at least eight data terminals disposed on first and second opposite sides of an axis, respectively,
wherein each of the data terminals of the first and second groups are configured to carry data signals for read and write access to random access addressable memory locations of a memory storage array within one or more of the semiconductor chips, and the data terminals of the first group have modulo-X symmetry about the axis with the second group of the data terminals, wherein X is an integer, wherein X is greater than two.

2. The microelectronic package as claimed in claim 1, wherein the at least two stacks of semiconductor chips includes four stacks of semiconductor chips.

3. The microelectronic package as claimed in claim 1, wherein the conductive structure includes wire bonds extending from the element contacts and electrically connected with the substrate contacts.

4. The microelectronic package as claimed in claim 1, wherein at least one of the upper semiconductor chips in the at least two stacks of semiconductor chips is electrically connected with a corresponding one of the lower semiconductor chips in the respective stack through the conductive structure.

5. The microelectronic package as claimed in claim 4, wherein at least some of the electrical connections between the at least one of the upper semiconductor chips in the at least two stacks of semiconductor chips and the corresponding one of the lower semiconductor chips in the respective stack are through wire bonds extending between at least some of the element contacts of the at least one of the upper semiconductor chips and the corresponding one of the lower semiconductor chips in the respective stack.

6. The microelectronic package as claimed in claim 4, wherein the at least one of the upper semiconductor chips in the at least two stacks of semiconductor chips is a plurality of upper semiconductor chips electrically connected with one another, and wherein at least some of the electrical connections between the plurality of upper semiconductor chips are through wire bonds.

7. The microelectronic package as claimed in claim 1, wherein the element contacts of each semiconductor chip of the at least two stacks of semiconductor chips are arranged in at least one column of contacts disposed adjacent an edge of the respective front face, and each column of contacts of each of the lower semiconductor chips in the at least two stacks of semiconductor chips is disposed beyond an edge of the corresponding one of the upper semiconductor chips in the respective stack.

8. The microelectronic package as claimed in claim 1, wherein the element contacts of each of the lower semiconductor chips of the at least two stacks of semiconductor chips include redistribution contacts exposed at the front face of the respective lower semiconductor chip, each redistribution contact being electrically connected with a contact pad of the respective lower semiconductor chip through at least one of a trace or a via, at least some of the redistribution contacts being displaced from the contact pads of the respective lower semiconductor chip in a direction along the front face of the lower semiconductor chip.

9. The microelectronic package as claimed in claim 1, wherein the element contacts of each of the lower semiconductor chips of the at least two stacks of semiconductor chips are arranged in at least one column of contacts disposed adjacent an edge of the respective front face, and the at least one column of contacts of the lower semiconductor chip of a first stack of the at least two stacks of semiconductor chips is parallel to the at least one column of contacts of the lower semiconductor chip of a second stack of the at least two stacks of semiconductor chips.

10. The microelectronic package as claimed in claim 1, wherein the front faces of the lower semiconductor chips of the at least two stacks of semiconductor chips are arranged in a single plane parallel to the first surface of the substrate.

11. The microelectronic package as claimed in claim 1, wherein X is equal to 2 raised to the power of n, n being greater than or equal to 2.

12. The microelectronic package as claimed in claim 1, wherein X is equal to N times 8, wherein N is a whole number greater than or equal to one.

13. The microelectronic package as claimed in claim 1, further comprising data strobe terminals provided on the first and second sides of the axis, respectively, wherein the signal class assignment of the data strobe terminal on the first side of the axis is symmetric about the axis with the signal class assignment of the data strobe terminal on the second side of the axis.

14. The microelectronic package as claimed in claim 1, further comprising data mask terminals provided on the first and second sides of the axis, respectively, wherein the signal class assignment of the data mask terminal on the first side of the axis is symmetric about the axis with the signal class assignment of the data mask terminal on the second side of the axis.

15. The microelectronic package as claimed in claim 1, wherein the terminals further including other terminals disposed between the first and second groups of data terminals that are configured to carry signals other than the signals carried by the data terminals.

16. The microelectronic package as claimed in claim 15, wherein the other terminals disposed between the first and second groups of data terminals are configured to carry address information usable by circuitry within the microelectronic package to determine an addressable memory location from among all the available addressable memory locations of the memory storage array.

17. The microelectronic package as claimed in claim 16, wherein the other terminals disposed between the first and second groups of data terminals are configured to carry all of the address information usable by the circuitry within the microelectronic package to determine the addressable memory location.

18. The microelectronic assembly as claimed in claim 16, wherein the other terminals disposed between the first and second groups of data terminals are configured to carry all of the command signals transferred to the microelectronic package, the command signals being write enable, row address strobe, and column address strobe signals.

* * * * *